(12) United States Patent
Sato et al.

(10) Patent No.: US 7,362,548 B2
(45) Date of Patent: Apr. 22, 2008

(54) MAGNETIC SENSOR AND MANUFACTURING METHOD THEREFOR

(75) Inventors: Hideki Sato, Iwata-gun (JP); Kokichi Aiso, Hamamatsu (JP); Yukio Wakui, Iwata-gun (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 11/497,378

(22) Filed: Aug. 2, 2006

(65) Prior Publication Data

US 2006/0268469 A1 Nov. 30, 2006

(51) Int. Cl.
*G11B 5/127* (2006.01)

(52) U.S. Cl. .............................. 360/324.11
(58) Field of Classification Search ............ None
See application file for complete search history.

(56) References Cited

U.S. PATENT DOCUMENTS

| | | | |
|---|---|---|---|
| 4,354,212 A | 10/1982 | Nouchi et al. | |
| 5,428,491 A | 6/1995 | Smith | |
| 5,654,854 A * | 8/1997 | Mallary | 360/327.3 |
| 5,982,177 A | 11/1999 | Cadieu | |
| 6,028,730 A * | 2/2000 | Ishihara | 360/66 |
| 6,529,114 B1 * | 3/2003 | Bohlinger et al. | 338/32 R |
| 6,633,462 B2 * | 10/2003 | Adelerhof | 360/315 |
| 6,700,760 B1 * | 3/2004 | Mao | 360/324.2 |
| 6,704,176 B2 * | 3/2004 | Shukh et al. | 360/324.12 |
| 6,707,298 B2 * | 3/2004 | Suzuki et al. | 324/252 |
| 6,791,807 B1 * | 9/2004 | Hikami et al. | 360/328 |
| 6,894,878 B1 * | 5/2005 | Cross | 360/314 |
| 6,904,669 B2 * | 6/2005 | Sato et al. | 29/603.1 |
| 7,005,958 B2 * | 2/2006 | Wan | 338/32 R |
| 7,034,651 B2 * | 4/2006 | Bohlinger | 338/100 |
| 7,202,771 B2 * | 4/2007 | Bohlinger | 338/32 R |
| 2002/0006017 A1 | 1/2002 | Adelerhof | |

(Continued)

FOREIGN PATENT DOCUMENTS

DE 905 523 7/1949

(Continued)

OTHER PUBLICATIONS

Hill et al., Sensors and Actuators A, vol. 59, pp. 30-37 (1997).

(Continued)

*Primary Examiner*—Allen Cao
(74) *Attorney, Agent, or Firm*—Dickstein, Shapiro, LLP.

(57) ABSTRACT

A magnetic sensor comprises magnetoresistive elements and permanent magnet films, which are combined together to form GMR elements formed on a quartz substrate having a square shape, wherein the permanent magnet films are paired and connected to both ends of the magnetoresistive elements, so that an X-axis magnetic sensor and a Y-axis magnetic sensor are realized by adequately arranging the GMR elements relative to the four sides of the quartz substrate. Herein, the magnetization direction of the pinned layer of the magnetoresistive element forms a prescribed angle of 45° relative to the longitudinal direction of the magnetoresistive element or relative to the magnetization direction of the permanent magnet film. Thus, it is possible to reliably suppress offset variations of bridge connections of the GMR elements even when an intense magnetic field is applied; and it is therefore possible to noticeably improve the resistant characteristics to an intense magnetic field.

8 Claims, 25 Drawing Sheets

U.S. PATENT DOCUMENTS

| | | | |
|---|---|---|---|
| 2002/0015251 A1* | 2/2002 | Ito et al. .................... 360/59 |
| 2002/0186516 A1* | 12/2002 | Larson et al. .......... 360/324.12 |
| 2003/0090843 A1* | 5/2003 | Shukh et al. .......... 360/324.12 |
| 2003/0141957 A1* | 7/2003 | Bohlinger ................. 338/32 R |
| 2003/0206384 A1* | 11/2003 | Hoshiya et al. ........ 360/324.12 |
| 2004/0000682 A1* | 1/2004 | Chen et al. ................. 257/295 |
| 2004/0047089 A1* | 3/2004 | Singleton et al. ...... 360/327.31 |
| 2004/0130323 A1* | 7/2004 | Oohashi et al. ............. 324/252 |
| 2004/0141257 A1* | 7/2004 | Hasegawa et al. .......... 360/314 |
| 2004/0160220 A1 | 8/2004 | Wendt |
| 2004/0212360 A1* | 10/2004 | Sato et al. .................. 324/200 |
| 2004/0246632 A1* | 12/2004 | Nishioka et al. ....... 360/324.11 |
| 2005/0212632 A1* | 9/2005 | Oohashi et al. ............. 335/215 |
| 2005/0270020 A1 | 12/2005 | Peczalski et al. |
| 2006/0007604 A1* | 1/2006 | Terunuma et al. .......... 360/322 |
| 2006/0007728 A1* | 1/2006 | Sundstrom ................. 365/158 |

FOREIGN PATENT DOCUMENTS

| | | |
|---|---|---|
| DE | 196 49 265 A1 | 6/1998 |
| DE | 197 42 366 C1 | 5/1999 |
| JP | 05-126577 | 5/1993 |
| JP | 6-61050 | 3/1994 |
| JP | 7-320231 | 12/1995 |
| JP | 9-91627 | 4/1997 |
| JP | 2000-338211 | 12/2000 |
| JP | 2001-168416 | 6/2001 |
| JP | 2002-299728 | 10/2002 |
| KR | 2002-0062852 | 7/2002 |

OTHER PUBLICATIONS

Ron Neale, "Taming the Giant MagnetoResistance (GMR) Effect", Sensors, Electronic Engineering, pp. 36-40 (Apr. 1996).

Smith et al., "The Growing Role of Solid-State Magnetic Sensing", pp. 139-149.

Spong et al., "Giant Magnetoresistive Spin Valve Bridge Sensor", IEEE Transactions on Magnetics, vol. 32, No. 2, pp. 366-371 (1996).

Daughton et al., "Magnetic Field Sensors Using GMR Multilayer", IEEE Transactions on Magnetics, vol. 30, No. 6, pp. 4608-4610 (1994).

English translation of relevant portion of JP 05-126577.

* cited by examiner

FIG. 43

| PROCESS | COMPARATIVE EXAMPLE | | EMBODIMENT 1 FINAL | EMBODIMENT 2 FINAL | EMBODIMENT 3 FINAL | EMBODIMENT 4 FINAL | EMBODIMENT 5 FINAL |
|---|---|---|---|---|---|---|---|
| | POST | FINAL | | | | | |
| SENSITIVITY (mV/Oe) | 4.1 | 3.6 | 1.8 | 2.0 | 1.8 | 0.95 | 0.90 |
| OFFSET VARIATIONS AFTER EXPOSURE OF 100 Oe (mV) | 0.082 | 0.288 | 0.036 | 0.059 | 0.072 | 0.028 | 0.036 |
| VARIATION RATIO TO SENSITIVITY (%) | 2 | 8 | 2 | 3 | 4 | 3 | 4 |
| OFFSET TEMPERATURE VARIATIONS (mV/°C) | — | 0.018 | 0.009 | 0.0044 | 0.0036 | 0.0018 | 0.0015 |
| RATIO TO SENSITIVITY OF TEMPERATURE VARIATIONS (%) | — | 0.5 | 0.5 | 0.22 | 0.2 | 0.19 | 0.17 |

MAGNETIC SENSOR AND MANUFACTURING METHOD THEREFOR

BACKGROUND OF THE INVENTION

1. Field of the Invention

This invention relates to magnetic sensors using magnetoresistive elements such as giant magnetoresistive (GMR) elements. This invention also relates to manufacturing methods for manufacturing magnetic sensors.

This application claims priority on Japanese Patent Application No. 2002-304392 and Japanese Patent Application No. 2003-65200, the contents of which are incorporated herein by reference.

2. Description of the Related Art

Conventionally, various types of magnetic sensors using magnetoresistive elements such as giant magnetoresistive (GMR) elements have been developed and reduced to practice.

A typical example of a GMR element comprises a pinned layer in which magnetization is pinned in a prescribed direction, and a free layer whose magnetization direction varies in response to an external magnetic field. That is, when an external magnetic field is applied, the GMR element presents resistance in response to a relative relationship in magnetization direction between the pinned layer and free layer; therefore, it is possible to detect the external magnetic field by measuring the resistance of the GMR element.

In order to detect minor external magnetic fields at a high accuracy, it is necessary for the aforementioned magnetic sensor to stably maintain the magnetization direction of each of the magnetized sections of the free layer to match a prescribed direction (hereinafter, referred to as an initialization direction) under the condition where no external magnetic field is applied to the magnetic sensor.

In general, a thin-film free layer is formed in a rectangular shape in plan view, so that a long side (e.g., a long axis or a longitudinal direction) of the rectangular shape is directed to match the aforementioned initialization direction so as to establish shape anisotropy in which the magnetization directions are aligned to match the longitudinal direction. By using shape anisotropy, the magnetization directions of the magnetized sections of the free layer are aligned to match the initialization direction. In order to stably restore and maintain the magnetization directions of the magnetized sections of the free layer in the initialization direction over a long term after an external magnetic field disappears, bias magnet films corresponding to permanent magnets are arranged at both ends of the free layer in the longitudinal direction, so that a prescribed magnetic field of the initialization direction is applied to the free layer by the bias magnet films.

In magnetoresistance-effect elements (i.e., magnetoresistive elements) of an AMR type, it is necessary to apply bias magnetic fields in order to increase sensitivities. In order to uniformly apply a bias magnetic field to four magnetoresistive elements, for example, they are inclined relative to a substrate by a prescribed angle of 45°. An example of a magnetic sensor in which magnetoresistive elements are inclined relative to a substrate is disclosed in Japanese Patent Application Publication No. Hei 5-126577 (see paragraph [0016], and FIG. 5(a)).

When an external magnetic field, which is relatively large and less than the coercive force of a bias magnet film and whose magnetization direction is opposite to the initialization direction, is applied to the conventionally-known magnetic sensor, each of the magnetized sections of the free layer is changed in magnetization direction; thereafter, when the external magnetic field disappears, each of the magnetized sections of the free layer cannot be restored and may not match the initialization direction. This deteriorates the detection accuracy of the magnetic sensor for sensing a magnetic field applied thereto.

It is very difficult to form two or more magnetoresistive elements, in which the magnetization directions of the pinned layers mutually cross each other, on a small substrate; therefore, no single chip having such a configuration has been developed and produced. That is, the conventionally-known magnetic sensor cannot be reduced in size, and it is very difficult to broaden an application range therefor due to a restriction regarding the magnetization direction of the pinned layer.

To cope with the aforementioned situation, it is possible to develop a two-axis magnetic sensor, using GMR elements, that can be reduced in size and that can be broadened in the application range, which is disclosed in Japanese Patent Application No 2001-281703.

FIG. 26 is a plan view showing a two-axis magnetic sensor using GMR elements, wherein a magnetic sensor 101 comprises a quartz substrate 102 having a roughly square shape and a prescribed thickness as well as X-axis GMR elements 111 to 114, and Y-axis GMR elements 121 to 124. Herein, all of the X-axis GMR elements 111-114 are formed on the quartz substrate 102 and are combined together to form an X-axis magnetic sensor for detecting magnetic fields in the X-axis direction, and all the Y-axis GMR elements 121-124 are formed on the quartz substrate 102 and are combined together to form a Y-axis magnetic sensor for detecting magnetic fields in the Y-axis direction perpendicular to the X-axis direction.

Two pairs of the X-axis GMR elements 111-112 and 113-114 are respectively arranged in proximity to the midpoints on two sides of the quartz substrate 102, which cross at a right angle to the X-axis, in such a way that they are arranged in parallel with each other. Similarly, two pairs of the Y-axis GMR elements 121-122 and 123-124 are respectively arranged in proximity to the midpoints on two sides of the quartz substrate 102, which cross at a right angle to the Y-axis, in such a way that they are arranged in parallel with each other.

The X-axis GMR elements 111 to 114 and the Y-axis GMR elements 121 to 124 differ from each other in their arrangements on the quartz substrate 102 and in their magnetization directions pinned in the pinned layers thereof. With the exception of these points, they are formed in the same configuration.

Therefore, the X-axis GMR element 111 is taken as an example whose configuration is to be described below.

As shown in FIGS. 27 and 28, the X-axis GMR element 111 comprises band-shaped spin valve films 131, which are arranged in parallel with each other, and bias magnet films 132, each of which corresponds to a thin film of a hard ferromagnetic substance, composed of CoCrPt and the like, having a high coercive force and a high squareness ratio.

The spin valve films 131 are respectively paired and connected together via the bias magnet films 132 at both ends thereof in such a way that one bias magnet film is arranged at one end of the 'paired' spin valve films, and the other bias magnetic film is arranged at the other end of the 'adjacent paired' spin valve films. In short, the spin valve films 131 are connected together via the bias magnet films 132 in a zigzag manner.

As shown in FIG. 29, the spin valve film 131 is formed in a sequential lamination of various layers on the quartz substrate 102, namely: a free layer F; a conductive spacer layer S, composed of Cu, having a film thickness of 2.4 nm (or 24 Å); a pinned layer PD composed of CoFe; a pinning layer PN composed of PtMn; and a capping layer C made of a thin metal film composed of titanium (Ti), tantalum (Ta), and the like.

The free layer F is changed in magnetization direction in response to the direction of an external magnetic field applied thereto, and it is formed by a CoZrNb amorphous magnetic layer 131a having a film thickness of 8 nm (or 80 Å), a NiFe magnetic layer 131b having a film thickness of 3.3 nm (or 33 Å) that is laminated on the CoZrNb amorphous magnetic layer 131a, and a CoFe layer 131c whose film thickness approximately ranges from 1 nm to 3 nm (or 10 Å to 30 Å) that is laminated on the NiFe magnetic layer 131b.

In order to maintain single-axis anisotropy of the free layer F, a bias magnetic field is applied to the free layer F by the bias magnet film 132 in the Y-axis direction shown in FIG. 27.

The spacer layer S is a thin metal film composed of Cu or a Cu alloy.

Both of the CoZrNb amorphous magnetic layer 131a and the NiFe magnetic layer 131b are formed from soft ferromagnetic substances. In addition, the CoFe layer 131c blocks Ni diffusion of the NiFe magnetic layer 131b and Cu diffusion of the spacer layer S.

The pinned layer PD is formed by a CoFe magnetic layer 131d having a film thickness of 2.2 nm (or 22 Å). The CoFe magnetic layer 131d is backed by an antiferromagnetic film 131e, which will be described later, in a switched connection manner so that the magnetization direction thereof is subjected to pinning (or anchoring) in the negative direction of the X-axis.

The pinning layer PN is formed by the antiferromagnetic film 131e having a film thickness of 24 nm (or 240 Å) laminated on the CoFe magnetic layer 131d, wherein the antiferromagnetic film 131e is composed of a PtNm alloy including Pt at 45-55 mol %. When a magnetic field is applied in the negative direction of the X-axis, the antiferromagnetic film 131e is changed to an ordered lattice.

Hereinafter, the combination of the pinned layer PD and the pinning layer PN will be generally called a pin layer.

All of the other X-axis GMR elements 112-114 and the Y-axis GMR elements 121-124 have the same configuration as the X-axis GMR element 111 described above; hence, the detailed descriptions thereof will be omitted.

Next, a description will be given with respect to the magnetic properties (or magnetic characteristics) of the X-axis GMR elements 111-114 and the Y-axis GMR elements 121-124.

FIG. 30 shows a graph regarding variations of resistance relative to the magnitude of an external magnetic field applied to the X-axis GMR element 111. Herein, 'solid' curves represent hysteresis characteristics relative to variations of the external magnetic field in the X-axis, in which the resistance varies approximately proportional to the external magnetic field in a prescribed range between −Hk and +Hk, but the resistance is maintained substantially constant in both of the other ranges outside of the prescribed range. In addition, 'dotted' curves represent characteristics relative to variations of the external magnetic field in the Y-axis, in which the resistance is maintained substantially constant.

In FIG. 26, magnetization directions of pinned layers adapted to the X-axis GMR elements 111-114 and the Y-axis GMR elements 121-124 are shown by arrows, which are directed opposite to each other.

That is, both of the X-axis GMR elements 111 and 112 have the same magnetization direction of the pinned layer that is pinned by the pinning layer along the negative direction of the X-axis.

Both of the X-axis GMR elements 113 and 114 have the same magnetization direction of the pinned layer that is pinned by the pinning layer along the positive direction of the X-axis.

In addition, both of the Y-axis GMR elements 121 and 122 have the same magnetization direction of the pinned layer that is pinned by the pinning layer along the positive direction of the Y-axis.

Both of the Y-axis GMR elements 123 and 124 have the same magnetization direction of the pinned layer that is pinned by the pinning layer along the negative direction of the Y-axis.

The aforementioned X-axis magnetic sensor is constituted by arranging the X-axis GMR elements 111-114 in a full bridge connection as shown in FIG. 31, wherein arrows accompanied with blocks show magnetization directions of pinned layers pinned by pinning layers. In the aforementioned constitution, a dc power source is used to apply voltage Vxin+ (e.g., 5 V) at one terminal and to apply voltage Vxin− (e.g., 0 V) at the other terminal, whereby Vxout+ appears at a terminal H that is derived from the connection between the X-axis GMR elements 111 and 113, and Vxout− appears at a terminal L that is derived from the connection between the X-axis GMR elements 112 and 114. Herein, it is possible to extract a potential difference (or a voltage difference) (Vxout+−Vxout−) as an output voltage Vxout.

In short, the X-axis magnetic sensor presents characteristics relative to variations of an external magnetic field in the X-axis, in which, as shown by the solid curves in FIG. 32, the output voltage Vxout thereof is changed substantially proportional to the external magnetic field in a prescribed range between −Hk and +Hk, and it is maintained substantially constant in other ranges outside of the prescribed range.

In addition, the output voltage Vout is substantially maintained at 0 V relative to variations of the external magnetic field in the Y-axis, which is shown by the dotted curves in FIG. 32.

Similar to the aforementioned X-axis magnetic sensor, the Y-axis magnetic sensor is constituted by arranging the Y-axis GMR elements 121-124 in a full bridge connection as shown in FIG. 33. In this constitution, a dc power source is used to apply voltage Vyin+ (e.g., 5 V) at one terminal and to apply voltage Vyin− (e.g., 0 V) at the other terminal, whereby Vyout+ appears at a terminal H that is derived from the connection between the Y-axis GMR elements 122 and 124, and Vyout− appears at a terminal L that is derived from the connection between the Y-axis GMR elements 121 and 123. Herein, it is possible to extract a potential difference (Vyout+−Vyout−) as an output voltage Vyout.

In short, the Y-axis magnetic sensor presents hysteresis characteristics relative to variations of an external magnetic field in the Y-axis, in which, as shown by dotted curves in FIG. 34, the output voltage Vyout thereof is changed substantially proportional to the external magnetic field in a prescribed range −Hk and +Hk, and it is maintained substantially constant in other ranges outside of the prescribed range.

In addition, the output voltage Vyout is substantially maintained at 0 V relative to variations of the external magnetic field in the Y-axis, which is shown by the solid curves in FIG. 34.

Next, a description will be given regarding a manufacturing method of the magnetic sensor 101.

As shown in FIG. 35, a plurality of island-like regions, corresponding to films M which contribute to formation of individual GMR elements, are formed on the surface of a quartz glass 141 having a rectangular shape. When the quartz glass 141 is subjected to a cutting process along break lines B and is thus divided into individual quartz substrates 102, the films M are arranged at prescribed positions to match the X-axis GMR elements 111-114 and the Y-axis GMR elements 121-124. In addition, alignment marks (i.e., positioning marks) 142 are formed on four corners of the quartz glass 141, wherein each of them is formed in a roughly rectangular shape from which a cross-shaped region is removed.

Next, there are provided a plurality of rectangular metal plates 144, each of which, as shown in FIGS. 36 and 37, has a plurality of through holes 143 having square openings, which are formed and regularly arranged in a lattice-like manner. In addition, permanent magnets 145, each having a rectangular parallelopiped shape whose cross-sectional shape substantially matches the opening shape of each of the through holes 143, are respectively inserted into the through holes 143 in such a way that the upper end surfaces of the permanent magnets 145 respectively inserted into the through holes 143 are all arranged in the same plane substantially in parallel with the surface of the metal plate 144, wherein the 'adjacent' permanent magnets 145 differ from each other in polarity.

Next, there is provided a plate 151, which is shown in FIG. 38, made of a transparent quartz glass having substantially the same shape as the metal plate 144. In addition, cross-shaped alignment marks (or positioning marks) 152 are formed on the four corners of the plate 151 to cooperate with the aforementioned alignment marks 142 of the quartz glass 141, thus establishing positioning between the quartz glass 141 and the plate 151. In addition, a plurality of alignment marks 153, each of which matches the contour shape of each of the permanent magnets 145, are formed in conformity with the positions of the through holes 143 of the metal plate 144.

The upper end surfaces of the permanent magnets 145 are adhered to the lower surface of the plate 151 by use of a prescribed adhesive. At this time, a prescribed positioning is established between the metal plate 144 (holding the permanent magnets 145) and the plate 151 by use of the alignment marks 153.

Thereafter, the metal plate 144 is removed from the lower side of the plate 151. Thus, it is possible to produce a magnet array in which the permanent magnet 145 are arranged on the plate 151 in a lattice-like manner and in which the 'adjacent' permanent magnets differ from each other in polarity.

As shown in FIG. 40, the quartz glass 141 is brought into contact with the plate 151 in such a way that the aforementioned films M come into contact with the upper surface of the plate 151. Herein, the prescribed positioning is established between the quartz glass 141 and the plate 151 by mutually matching the alignment marks 142 with the alignment marks 152. Then, fixing members 155 such as clips are used to fix the quartz glass 141 and the plate 151 together.

In the aforementioned state, as shown in FIG. 41, magnetic forces are formed in directions from the N pole of one permanent magnet 145 towards the S poles of adjacent permanent magnets 145. Therefore, as shown in FIG. 42, magnetic forces are applied to the films M, which are arranged to encompass one permanent magnet 145, in four directions, that is, the positive direction of the Y-axis, the positive direction of the X-axis, the negative direction of the Y-axis, and the negative direction of the X-axis.

The quartz glass 141 and the plate 151 fixed together by the fixing members 155 are subjected to a heat treatment for four hours at a prescribed temperature ranging from 250° C. to 280° C., for example. Thus, it is possible to order the pinning layers and to pin the pinned layers of the GMR elements. The quartz glass 141 and the plate 151 are separated from each other, and passivation films and polyimide films are formed for the purpose of protection; then, the quartz glass 141 is subjected to cutting on break lines B. Thus, the magnetic sensor 101 is produced.

Compared with the conventionally-known magnetic sensor in which magnetoresistive elements of the AMR type are inclined at 45° relative to the substrate, the aforementioned two-axis magnetic sensor has an advantage which allows magnetic measurement on geomagnetic levels without using bias magnetic fields; however, when applied with an intense magnetic field, the magnetized states thereof are unexpectedly changed so as to cause unwanted offsets in the bridge configurations of the GMR elements.

To cope with the aforementioned drawback, it is possible to suppress offset variations against the influence of an intense magnetic field by attaching permanent magnets to both ends of the GMR elements. Specifically, a relatively great magnetic field that is greater than the coercive force Hc of the permanent magnet is applied to the GMR element in the longitudinal direction, i.e., longitudinal direction of the free layer, so that the free layer is being initialized at the same time that the permanent magnet is attached so as to cause magnetization. Herein, it is possible to use the aforementioned magnet array, which is used in an ordering heat treatment of pin layers, in this method.

In the aforementioned method, however, it is necessary to apply a magnetic field in a direction perpendicular to the longitudinal direction of the GMR element in the ordering heat treatment, and it is also necessary to apply a magnetic field whose magnetism is identical to that of the permanent magnet in the longitudinal direction of the GMR element. Herein, magnetic fields of different directions are required in the aforementioned steps.

In the magnet array, under the ordering heat treatment, each of the permanent magnets should be arranged such that the center of gravity thereof is coincident with the center of each cell on the quartz glass, and when each of them is arranged to cause magnetization, it should be shifted in position so that the center of gravity thereof is coincident with each of the four corners of the quartz glass. This may cause positional deviations, which in turn cause the initialization direction to be shifted and thus deteriorates the measurement accuracy. When the aforementioned magnetic sensor is used under the influence of an intense magnetic field, offsets become easy to vary.

As described above, the aforementioned two-axis magnetic field may have an advantage in the reduction of the hysteresis characteristics of the GMR elements under the influence of a weak magnetic field; however, this would not sufficiently contribute to the stability of the offsets.

Magnetized states that are unexpectedly moved under the influence of an intense magnetic field may be restored to the original ones by applying an initialization magnetic field to form thin film coils, which are embedded beneath the GMR elements. However, this method does not sufficiently contribute to the stability of the offsets.

SUMMARY OF THE INVENTION

It is an object of the invention to provide a magnetic sensor that can be controlled in offset variations, regardless of the influence of an intense magnetic field applied thereto, so as to improve the magnetic characteristics with respect to the intense magnetic field.

It is another object of the invention to provide a manufacturing method for manufacturing the aforementioned magnetic sensor.

A magnetic sensor of this invention comprises magnetoresistive elements and permanent magnet films, which are combined together to form GMR elements formed on a quartz substrate having a square shape, wherein the permanent magnet films are paired and connected to both ends of the magnetoresistive elements. That is, the magnetic sensor detects the magnitude of an external magnetic field applied thereto in two axial directions, so that an X-axis magnetic sensor and a Y-axis magnetic sensor are realized by adequately arranging the GMR elements relative to the four sides of the quartz substrate. In particular, this invention is characterized in that the magnetization direction of the pinned layer of the magnetoresistive element forms a prescribed angle of 45° relative to the longitudinal direction of the magnetoresistive element. Alternatively, the magnetization direction of the pinned layer of the magnetoresistive element forms a prescribed angle of 45° relative to the magnetization direction of the permanent magnet film. Thus, it is possible to reliably suppress offset variations of bridge connections of the GMR elements even when an intense magnetic field is applied; and it is therefore possible to noticeably improve the resistant characteristics to an intense magnetic field.

A manufacturing method of the magnetic sensor of this invention is characterized in that an ordering heat treatment is performed by arranging a substrate on a magnet array in which a plurality of permanent magnets are arranged such that adjoining permanent magnets differ from each other in polarity, wherein the permanent magnets are positioned respectively or selectively on the four corners of a cell (corresponding to the quartz substrate) within the substrate, which is then heated. Alternatively, the ordering heat treatment is performed by arranging the substrate such that the magnetization direction of the pinned layer of the magnetoresistive element matches the diagonal line of the substrate, which is then heated, wherein the permanent magnet films are adequately magnetized using a magnet array in which adjoining permanent magnets differ from each other in polarity.

Thus, it is possible to produce the magnetic sensor, in which the magnetization direction of the pinned layer of the magnetoresistive element forms a prescribed angle of 45° relative to the magnetization direction of the permanent magnet film, by simple processes with ease.

BRIEF DESCRIPTION OF THE DRAWINGS

These and other objects, aspects, and embodiments of the present invention will be described in more detail with reference to the following drawings, in which:

FIG. 43 is a table showing the experimental results upon comparison between the embodiments and a comparative example corresponding to a two-axis magnetic sensor.

DESCRIPTION OF THE PREFERRED EMBODIMENTS

This invention will be described in further detail by way of examples with reference to the accompanying drawings.

1. First Embodiment

Figure 1:
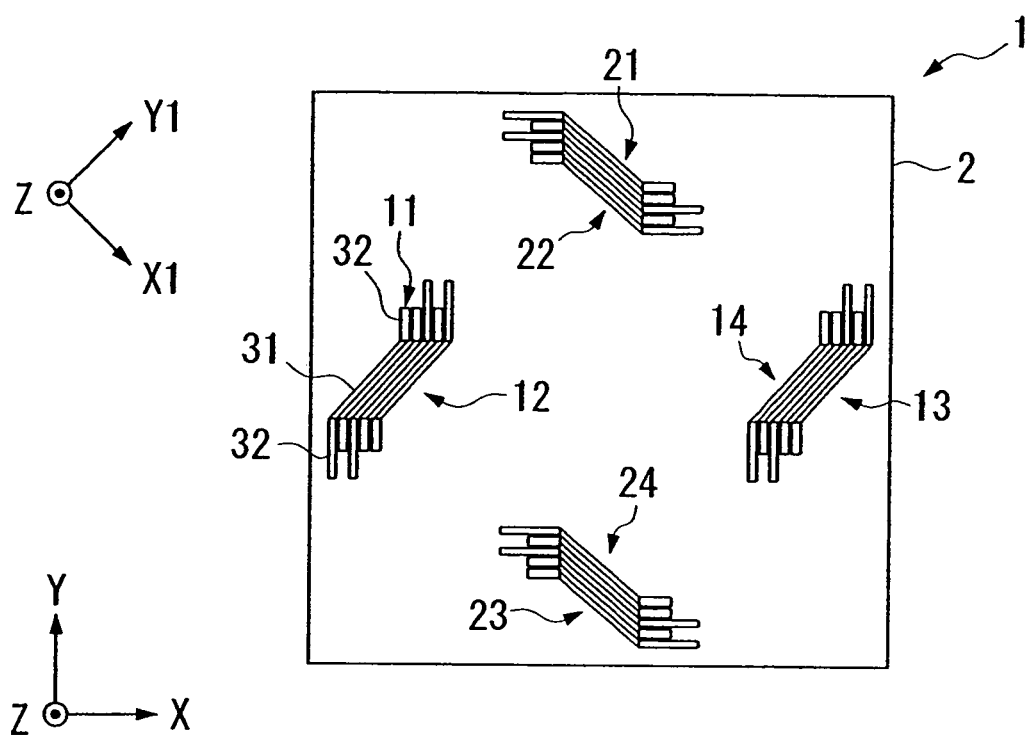
FIG. 1 is a plan view showing a magnetic sensor using GMR elements in accordance with a first embodiment of the invention.

FIG. 1 is a plan view showing a two-axis magnetic sensor using GMR elements in accordance with a first embodiment of the invention.

That is, a magnetic sensor 1 comprises a quartz substrate 2 having a prescribed thickness and a roughly square shape, X-axis GMR elements 11 to 14 that are formed on the quartz substrate 2 so as to form an X-axis magnetic sensor for detecting magnetic fields in an X1-axis direction, and Y-axis GMR elements 21 to 24 that are formed on the quartz substrate 2 so as to form a Y-axis magnetic sensor for detecting magnetic fields in a Y1-axis direction, which is perpendicular to the X1-axis direction. Specifically, the sensing direction of the X-axis magnetic sensor lies in the X1-axis direction that is formed 45° relative to the X-axis direction, and the sensing direction of the Y-axis magnetic sensor lies in the Y1-axis direction that is formed 45° relative to the Y-axis direction.

In the above, it is possible to substitute silicone for the material of the quartz substrate 2.

In FIG. 1, the X-axis GMR elements 11 to 14 are paired and respectively arranged in proximity to the midpoints on two sides of the quartz substrate 2, which are perpendicular to the X-axis, in such a way that they are arranged in parallel with each other. Similarly, the Y-axis GMR elements 21 to 24 are paired and respectively arranged in proximity to the midpoints on the other two sides of the quartz substrate 2, which are perpendicular to the Y-axis, in such a way that they are arranged in parallel with each other.

Each of the X-axis GMR elements 11-14 and the Y-axis GMR elements 21-24 is constituted by a plurality of band-shaped magnetoresistive elements 31, which are composed of spin valve films arranged in parallel with each other, and a plurality of permanent magnet films 32, which are connected with both ends of the magnetoresistive elements 31 in longitudinal directions and which are composed of thin films of a hard ferromagnetic substance such as CoCrPt having a high coercive force and a high squareness ratio, wherein a prescribed angle of 45° is formed between the longitudinal direction of the magnetoresistive element 31 and the longitudinal direction of the adjoining permanent magnet film 32.

In addition, each of the magnetoresistive elements 31 is arranged in such a way that the longitudinal direction thereof forms a prescribed angle of 45° relative to the proximate side of the quartz substrate 2. In addition, each of the permanent magnet films 32 is arranged in such a way that the longitudinal direction thereof is in parallel with the proximate side of the quartz substrate 2, wherein the permanent magnet film 32 arranged at one end of the magnetoresistive element 31 differs from the other permanent magnet film 32 arranged at the other end of the magnetoresistive element 31 in the distance measured from the proximate side of the quartz substrate 2.

The magnetization direction of the free layer of the magnetoresistive element 31 lies in the longitudinal direction thereof, and the magnetization direction of the permanent magnet film 32 also lies in the longitudinal direction thereof. Hence, a prescribed angle of 45° is formed between the magnetization direction of the free layer of the magnetoresistive element 31 and the magnetization direction of the permanent magnet film 32.

In addition, the magnetization direction pinned in the pinned layer of the magnetoresistive element 31 is formed 45° relative to the longitudinal direction of the magnetoresistive element 31. That is, the direction of a magnetic field applied in the ordering heat treatment is formed 45° relative to the longitudinal direction of the magnetoresistive element 31.

Furthermore, the magnetization direction pinned in the pinned layer of the magnetoresistive element 31 is identical to the magnetization direction of the permanent magnet film 32. That is, the direction of a magnetic field applied in the ordering heat treatment is identical to the direction of a magnetic field applied to magnetize the magnetoresistive element 31.

The structure of the spin valve film of the magnetoresistive element 31 is identical to the foregoing structure of the spin valve film 131 used for the X-axis GMR elements 111-114 and the Y-axis GMR elements 121-124; hence, the detailed description thereof will be omitted.

The present embodiment is characterized in that each of the X-axis GMR elements 11-14 and the Y-axis GMR elements 21-24 defines the magnetization direction of the pinned layer PD of the magnetoresistive element 31 so as to be identical to the magnetization direction of the permanent magnet film 32.

In addition, the magnetoresistive element 31 and the permanent magnet film 32 are connected together in such a way that the longitudinal direction of the free layer F is inclined against the longitudinal direction of the permanent magnet film 32 by 45°.

Next, a manufacturing method of the magnetic sensor 1 will be described in detail.

Figure 2:
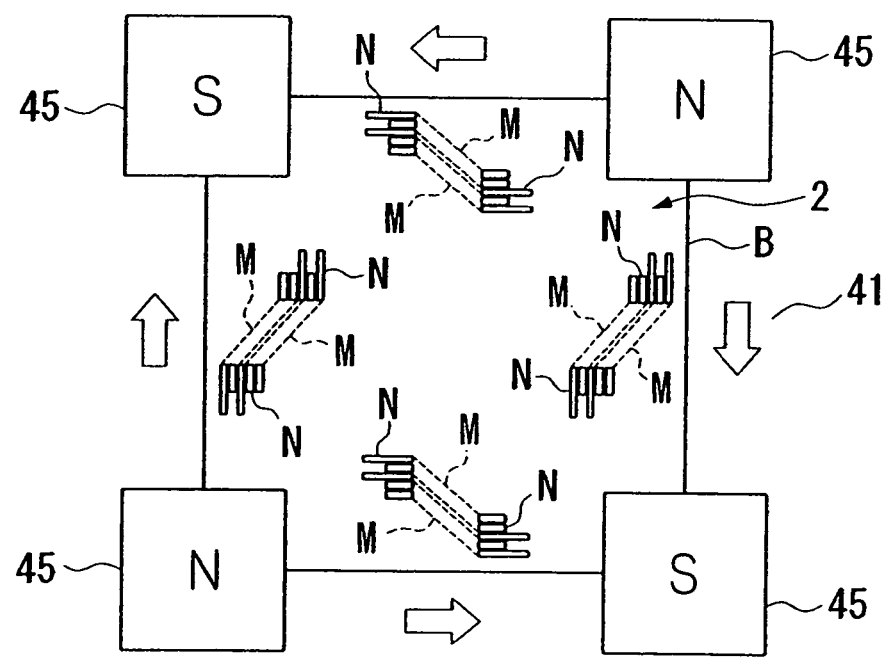
FIG. 2 is a plan view showing a quartz substrate arranging GMR elements for use in the manufacture of the magnetic sensor of the first embodiment.

Similar to the foregoing magnetic sensor 101, a plurality of island regions corresponding to the permanent magnet films 32, which are connected with GMR elements respectively, are arranged and formed on the surface of a rectangular-shaped quartz glass 41. As shown in FIG. 2, films N corresponding to the permanent magnet films 32 define regions M for arranging the GMR elements, so that when the quartz glass 41 is subjected to a cutting process along break lines B and is thus divided into individual quartz substrates 2, the regions M are aligned to match prescribed positions of the X-axis GMR elements 11-14 and the Y-axis GMR elements 21-24.

In addition, alignment marks (not shown) are formed on the four corners of the quartz glass 41. After formation of the permanent magnet films 32, a film (or films) for forming the GMR elements is formed on the overall surface of the quartz glass 41.

Figure 3:
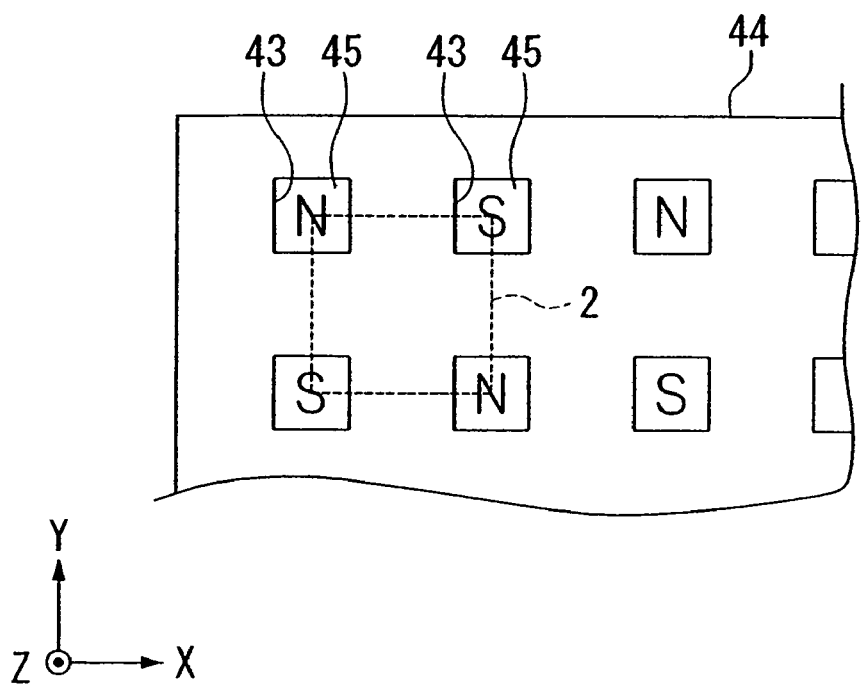
FIG. 3 is a partial plan view showing a metal plate for use in the manufacture of the magnetic sensor of the first embodiment.
Figure 4:
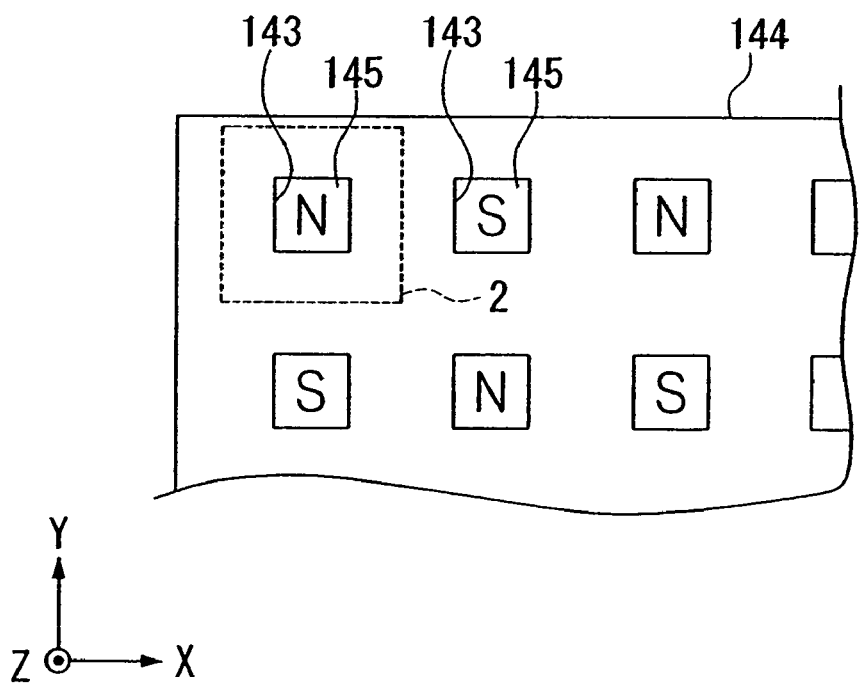
FIG. 4 is a partial plan view showing a metal plate for use in the manufacture of a conventional magnetic sensor.

Next, as shown in FIG. 3, there is provided a metal plate 44 in which a plurality of through holes 43 each having a square-shaped opening are formed in a lattice-like manner. A plurality of permanent magnets 45 each having a rectangular parallelopiped shape whose cross-sectional shape substantially matches the opening of the through hole 43 are respectively inserted into the through holes 43 in such a way that the upper end surfaces thereof are aligned substantially in the same plane in parallel with the surface of the metal plate 44, and the 'adjoining' permanent magnets 45 differ from each other in polarity.

Next, there is provided a plate made of a transparent quartz glass, which has substantially the same shape as the metal plate 44. Similar to the foregoing plate 151 shown in FIG. 38, alignment marks 153 are formed at prescribed positions in correspondence with the through holes 43.

Figure 38:
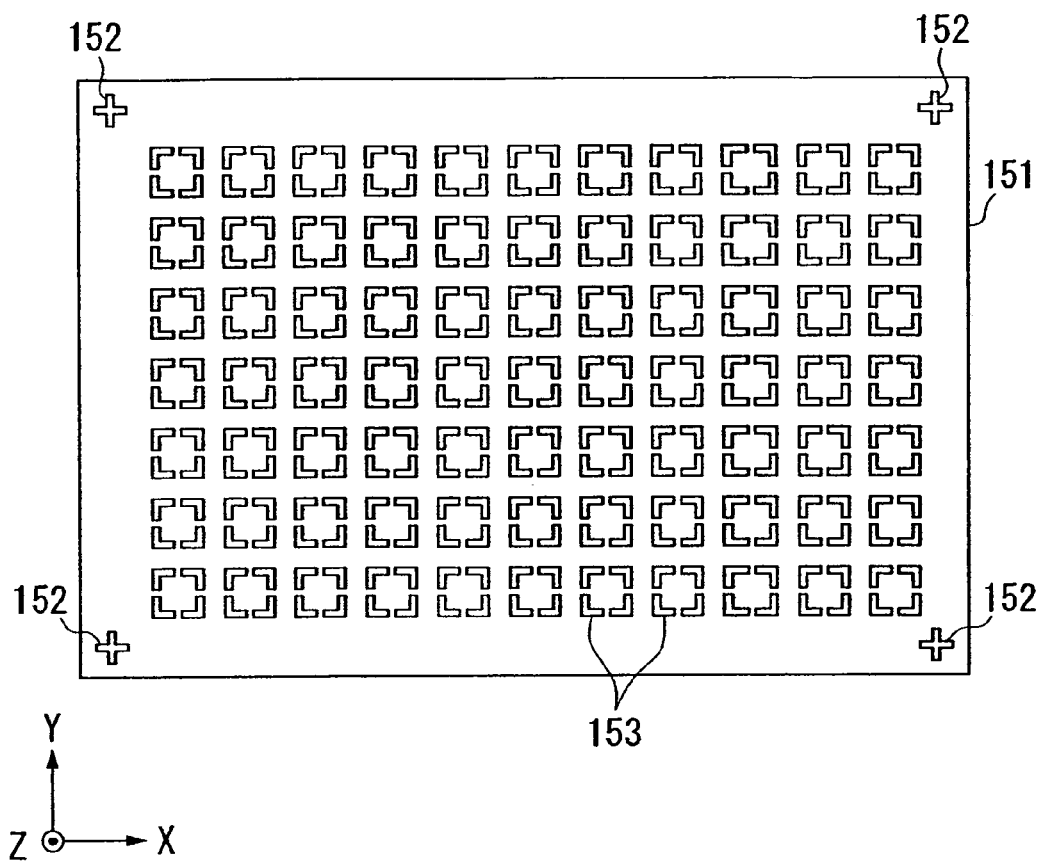
FIG. 38 is a plan view showing a transparent quartz glass plate for use in the manufacture of the two-axis magnetic sensor.
Figure 39:
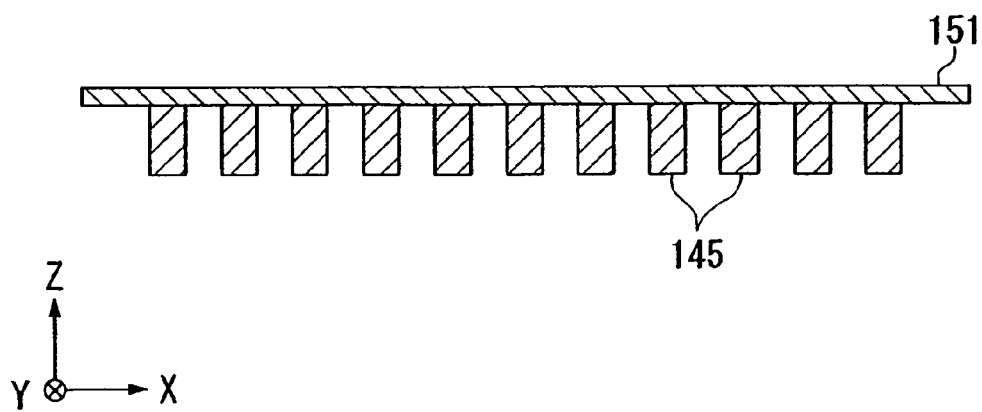
FIG. 39 is a cross sectional view showing that permanent magnets of a magnet array are adhered to the transparent quartz glass plate.

In the above, the foregoing alignment marks 152 are formed at the four corners of the plate in order to establish prescribed positioning between the quartz glass 41 and the plate, wherein in the present embodiment compared with the foregoing example shown in FIG. 38, each of them is shifted in position in both the negative direction of the X-axis and the negative direction of the Y-axis by half of the length of the side of the quartz substrate 2, in other words, it is shifted by a half pitch. Of course, it is possible to form both of the foregoing alignment marks 152 and the half-pitch shifted alignment marks on the plate.

A magnet array is constituted by arranging the permanent magnets 45 in a lattice-like manner, wherein the upper end surfaces of the permanent magnets 45 are adhered to the lower surface of the plate by use of a prescribed adhesive. At this time, the prescribed positioning is established between the permanent magnets 45 and the plate by use of the aforementioned alignment marks 153.

Next, the metal plate 44 is removed, so that the magnet array is produced in which the permanent magnets 45 are arranged in a lattice-like manner in such a way that the adjoining permanent magnets 45 differ from each other in polarity.

The quartz glass 41 and the plate are combined in such a way that the films M are brought into contact with the upper surface of the plate. Herein, the prescribed positioning is established between the quartz glass 41 and the plate by mutually matching half-pitch shifted alignment marks of the plate with the foregoing alignment marks of the quartz glass 41. Thus, it is possible for the four corners of the quartz substrate 2, which forms an individual cell derived from the quartz glass 41, to coincide with the centers of gravity of the permanent magnets 45 respectively. Thereafter, the quartz glass 41 and the plate are fixed together by using a plurality of fixing members such as clips.

Next, the pinning layer PN of the magnetoresistive element 31 is subjected to an ordering heat treatment, wherein the pinned layer PD is subjected to pinning as well.

Under the condition where the quartz glass 41 and the plate are fixed together, as shown in FIG. 2, permanent magnets 45 are arranged at the four corners of the quartz substrate 2, which is divided by the subsequent cutting process, in such a way that adjacent permanent magnets differ from each other in polarity. Therefore, a magnetic field is caused to occur in a direction from the N pole of the permanent magnet 45 to the S pole of the other 'adjacent' permanent magnet 45, wherein it is directed in parallel to each side of the quartz substrate 2. That is, a magnetic field is applied to each film M in a direction that is inclined by 45° with respect to the longitudinal direction of the pin layer of the magnetoresistive element 31.

Next, the quartz glass 41 and the plate, which are fixed together using the fixing members, are subjected to a heat treatment for four hours under vacuum at a prescribed temperature ranging from 250° C. to 280° C.

Thus, it is possible to complete an ordering heat treatment on the pinning layer PN within the pin layer of the magnetoresistive element 31 belonging to each of the X-axis GMR elements 11-14 and the Y-axis GMR elements 21-24. Herein, the pinned layer PD is subjected to pinning in a switched connection manner.

Thereafter, the X-axis GMR elements 11-14 and the Y-axis GMR elements 21-24 are subjected to patterning and are thus arranged in prescribed patterns, wherein the permanent magnets 32 are adequately connected together in a zigzag manner.

Figure 5:
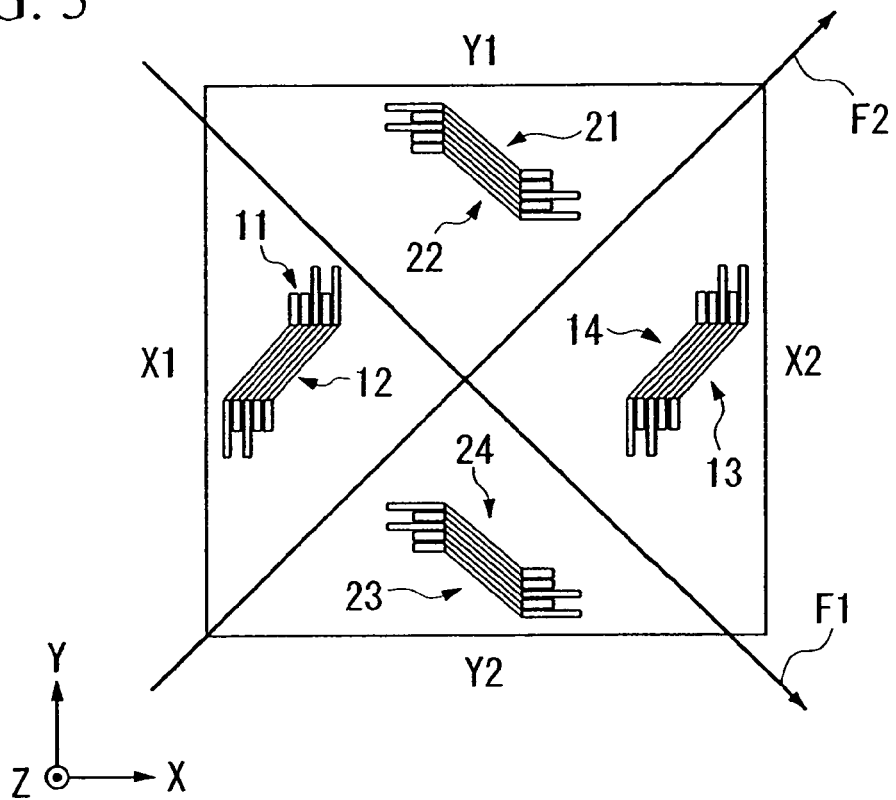
FIG. 5 is a plan view showing sensing directions F1 and F2 with regard to X-axis and Y-axis GMR elements incorporated in the magnetic sensor of the first embodiment.

The aforementioned magnetic sensor 1 has an X-axis sensing direction F1 and a Y-axis sensing direction F2 with respect to the pin layers of the magnetoresistive elements 31 as shown in FIG. 5, wherein the X-axis sensing direction F1 is inclined by 45° relative to one side of the quartz substrate 2, and the Y-axis sensing direction F2 is inclined by 45° relative to the other side of the quartz substrate 2.

Figure 6:
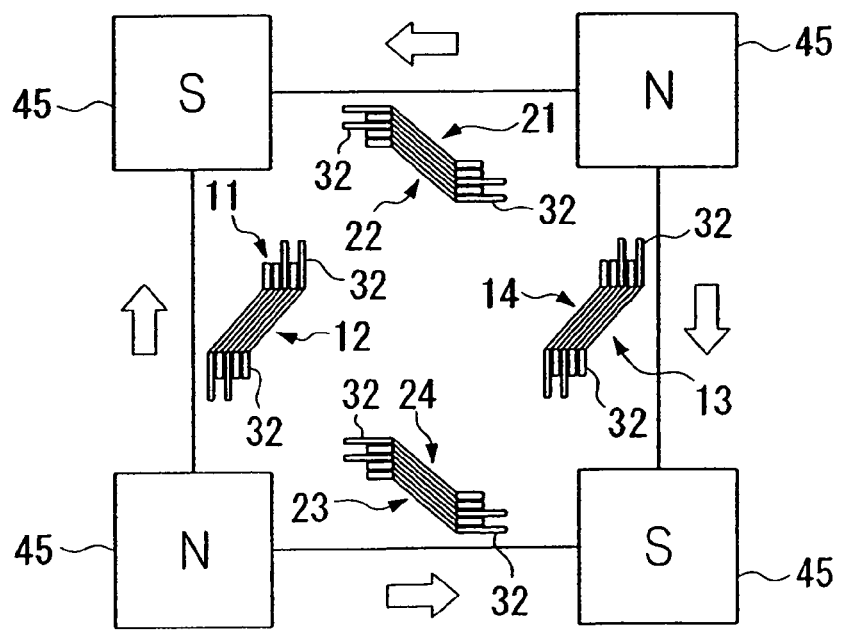
FIG. 6 is a plan view showing the arrangements of GMR elements and permanent magnets on the quartz substrate for use in the manufacture of the magnetic sensor of the first embodiment.

Next, the same magnet array is used without changing the position thereof, so that, as shown in FIG. 6, the permanent magnet films 32 are arranged to start magnetization thereby under the condition where the permanent magnets 45 are arranged such that the centers of gravity thereof coincide with the four corners of the quartz substrate 2 respectively. Herein, magnetization directions of the permanent magnets 32 are set to be identical to the magnetization directions of the pinned layers PD of the magnetoresistive elements 31. Therefore, the pinned layers PD of the magnetoresistive elements 31 are reliably subjected to pinning; hence, it is possible to produce the magnetic sensor 1 that is influenced by magnetization of the permanent magnets 32.

Figure 7:
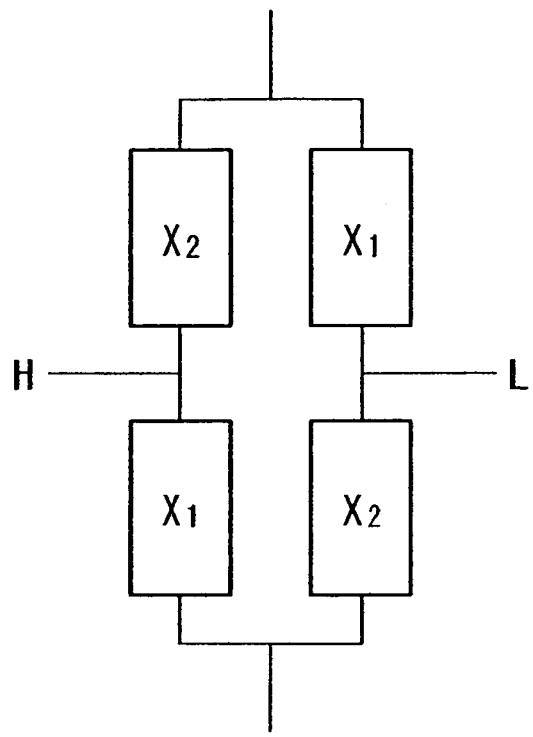
FIG. 7 is a block diagram simply showing a bridge connection established among the X-axis GMR elements.

FIG. 7 shows a bridge connection established among the X-axis GMR elements 11-14 forming the X-axis magnetic sensor incorporated in the magnetic sensor 1, wherein reference symbol $X_1$ designates the X-axis GMR elements 11 and 12, and $X_2$ designates the X-axis GMR elements 13 ad 14. All the sensing directions of the X-axis GMR elements 11-14 match the aforementioned X-axis sensing direction F1 shown in FIG. 5; hence, when an external magnetic field is applied in a direction opposite to the X-axis sensing direction F1, a terminal 'L' becomes higher in potential compared with another terminal 'H'.

Figure 8:
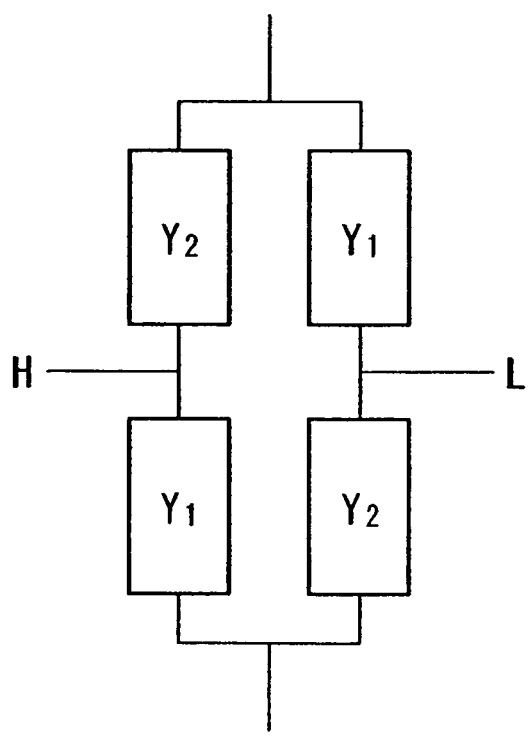
FIG. 8 is a block diagram simply showing a bridge connection established among the Y-axis GMR elements.

FIG. 8 shows a bridge connection established among the Y-axis GMR elements 21-24 forming the Y-axis magnetic sensor incorporated in the magnetic sensor 1, wherein reference symbol $Y_1$ designates the Y-axis GMR elements 21 and 22, and $Y_2$ designates the Y-axis GMR elements 23 and 24. All the sensing directions of the Y-axis GMR elements 21-24 match the aforementioned Y-axis sensing direction F2 shown in FIG. 5; hence, when an external magnetic field is applied in a direction opposite to the Y-axis sensing direction F2, a terminal 'L' becomes higher in potential compared with another terminal 'H'.

Figure 9:
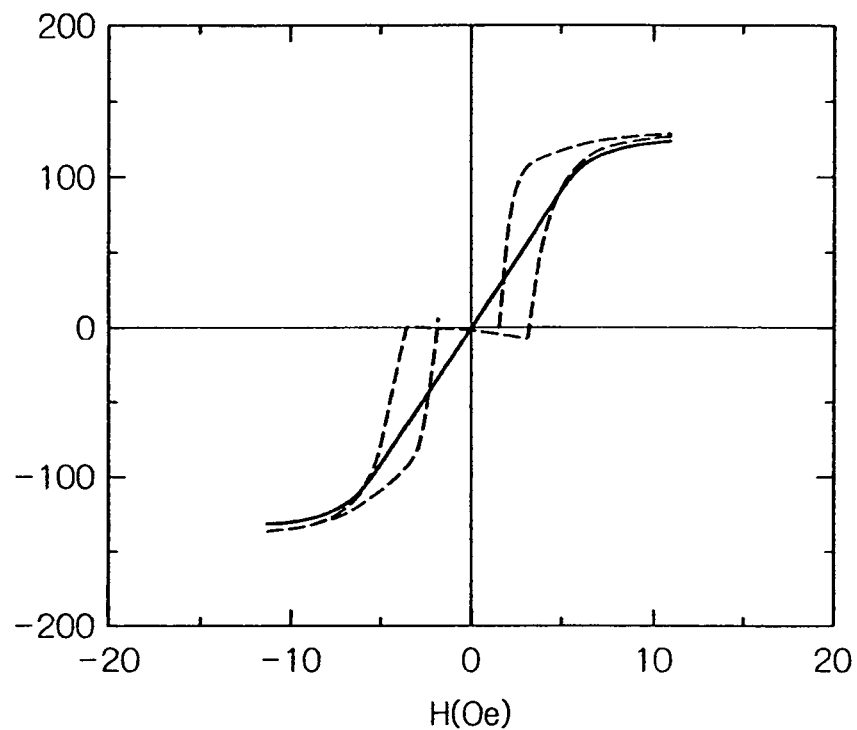
FIG. 9 is a graph showing the magnetic characteristics of the X-axis and Y-axis GMR elements incorporated in the magnetic sensor of the first embodiment.
Figure 10:
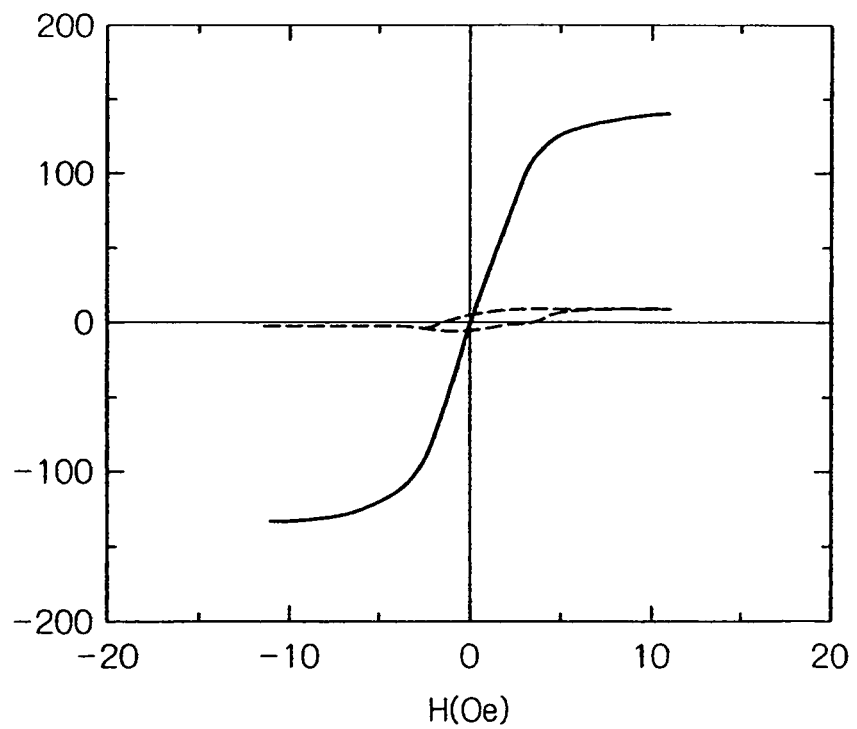
FIG. 10 is a graph showing the magnetic characteristics of the X-axis and Y-axis GMR elements incorporated in the conventional magnetic sensor.

FIG. 9 shows the magnetic characteristics of the X-axis GMR elements 11-14 and the Y-axis GMR elements 21-24 incorporated in the magnetic sensor 1, and FIG. 10 shows the magnetic characteristics of the X-axis GMR elements 111-114 and the Y-axis GMR elements 121-124 incorporated in the foregoing magnetic sensor 101. Herein, solid curves represent the magnetic characteristics of the sensing directions of the GMR elements, and dotted curves represent the magnetic characteristics of the non-sensing directions of the GMR elements.

As shown in FIG. 9, a hysteresis loop cannot be recognized with regard to the sensing directions of the GMR elements 11-14 and 21-24. In addition, a hysteresis loop may also be recognized with regard to the non-sensing directions of the GMR elements 11-14 and 21-24, whereas it disappears at or in proximity to a 'zero' value of the magnetic field; thus, it is possible to improve the resistant characteristics to an intense magnetic field.

FIG. 10 shows that a hysteresis loop may be recognized with regard to the non-sensing directions of the foregoing GMR elements 111-114 and 121-124, wherein it lies in proximity to a 'zero' value of the magnetic field; hence, the resistant characteristics to an intense magnetic field must be reduced.

In summary, it is possible to noticeably improve the resistant characteristics to an intense magnetic field in the GMR elements incorporated in the magnetic sensor 1 of the present embodiment, in which each of the permanent magnet films 32 is arranged to form a prescribed angle of 45° relative to the longitudinal direction of each of the magnetoresistive elements 31, compared with the GMR elements incorporated in the foregoing magnetic sensor 101.

As described above, the magnetic sensor 1 of the present embodiment is produced in such a way that the X-axis GMR elements 11-14 and the Y-axis GMR elements 21-24 are formed on the quartz substrate 2, wherein the magnetoresistive elements 31 thereof are arranged such that each of the magnetization directions of the pinned layers PD forms a prescribed angle of 45° relative to each of the magnetization directions of the free layers F. Therefore, even when an intense magnetic field is applied, it is possible to reliably suppress offset variations of the bridges, which in turn contributes to a noticeable improvement in the resistant characteristics to an intense magnetic field.

According to the manufacturing method of the magnetic sensor 1 of the present embodiment, the permanent magnets 45 are arranged at the four corners of the quartz substrate 2, which is divided in the subsequent cutting process, in such a way that the adjoining permanent magnets 45 differ from each other in polarity, in which a magnetic field is applied to each permanent magnet film M in the longitudinal direction; therefore, even when an intense magnetic field is applied, it is possible to reliably suppress offset variations of the bridge circuits. In summary, it is possible to produce the magnetic sensor 1, which can noticeably improve the resistant characteristics to an intense magnetic field, with ease by simple processes.

The present embodiment uses the plate that has the through holes 43 without changing the shapes and distances compared with the foregoing through holes 143, in which each of the alignment marks is shifted in position by a half pitch. Of course, it is possible to use another plate in which each of the through holes is shifted in position by a half pitch. In addition, it is possible to use a plate in which both of the foregoing alignment marks and the new alignment marks each shifted in position by a half pitch are formed.

Figure 11A:
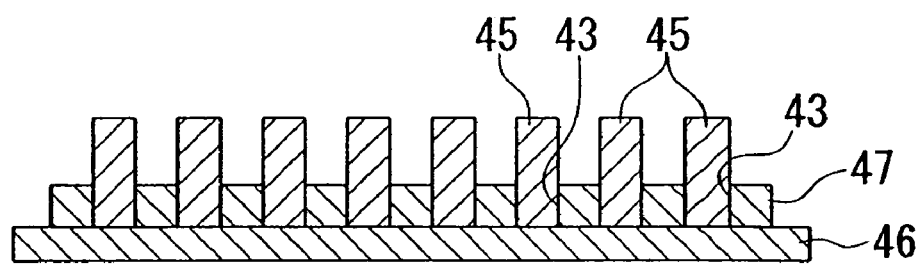
FIG. 11A is a cross sectional view showing a combination of a substrate and a metal plate for holding permanent magnets in the manufacture of the magnetic sensor.

The magnet array adapted to the present embodiment is not necessarily limited to one in which the permanent magnets 45 are adhered to the plate 44 made by the aforementioned quartz glass. That is, it is possible to use a substrate 46 composed of a $Ni_{42}Fe_{58}$ alloy, and a metal plate 47 composed of tungsten (W) in which a plurality of through holes 43 conforming with the exterior shapes of the permanent magnets 45 are formed, so that the substrate 46 and the metal plate 47 are adhered together as shown in FIG. 11A, whereby the permanent magnets 45 are respectively inserted into the through holes 43.

Figure 11B:
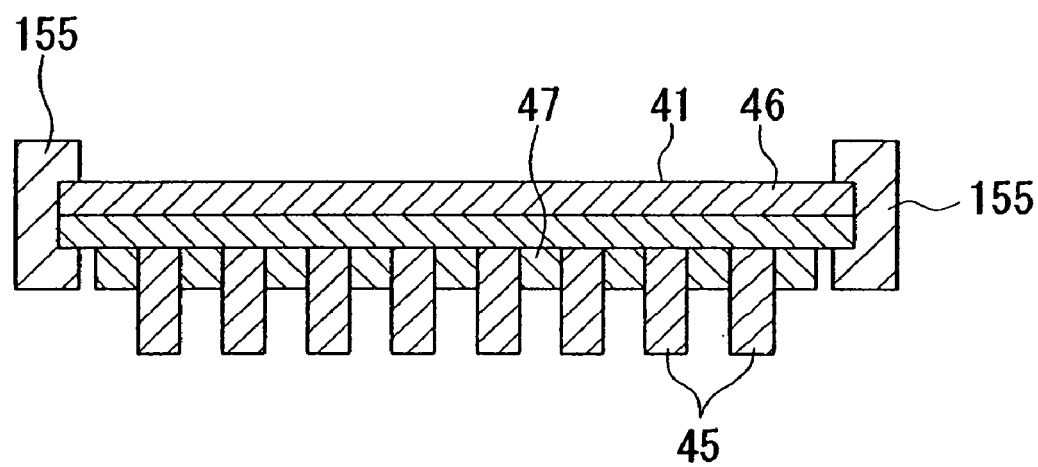
FIG. 11B is a cross sectional view in which the substrate and the metal plate are fixed together using fixing members.
Figure 40:
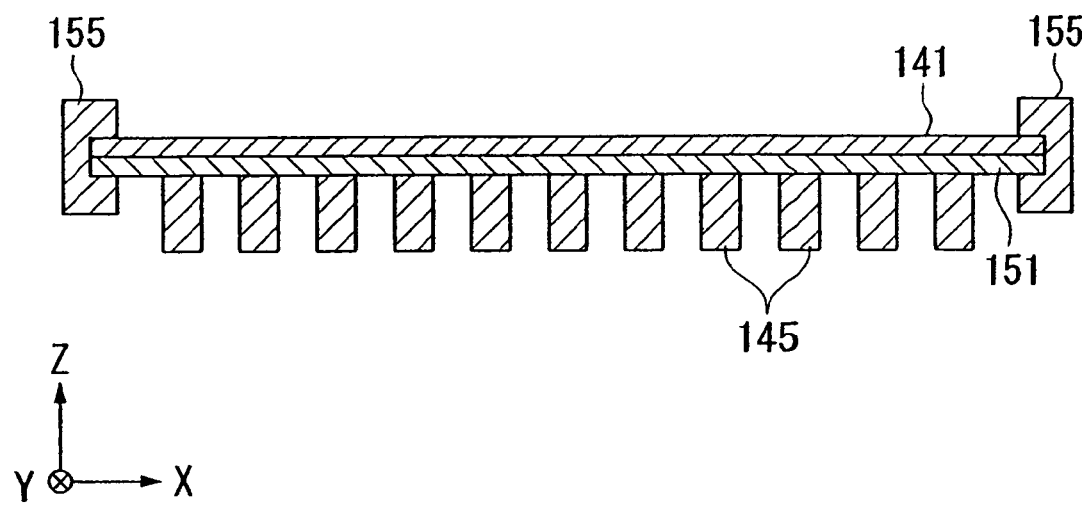
FIG. 40 is a cross sectional view showing that a quartz glass and the transparent quartz glass plate holding the permanent magnets are fixed together via fixing members.
Figure 41:
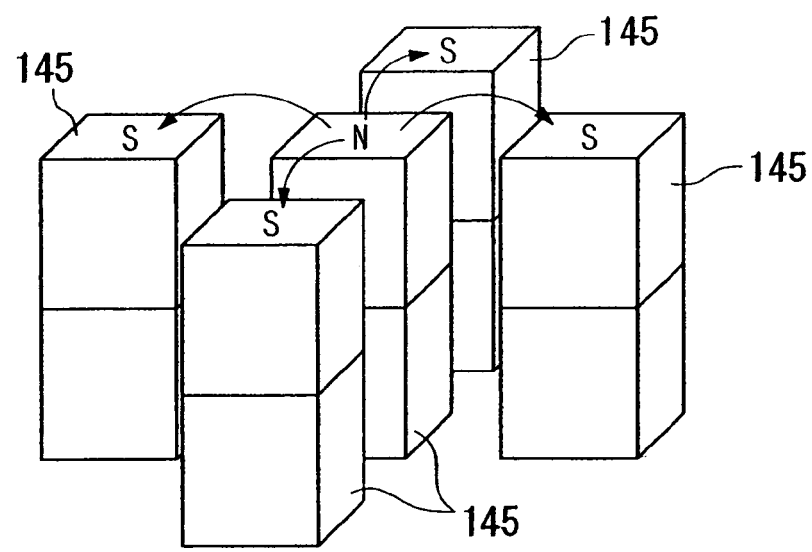
FIG. 41 is a perspective view diagrammatically showing the directions of magnetic forces applied among permanent magnets, which are arranged adjacent to each other in the magnet array.
Figure 42:
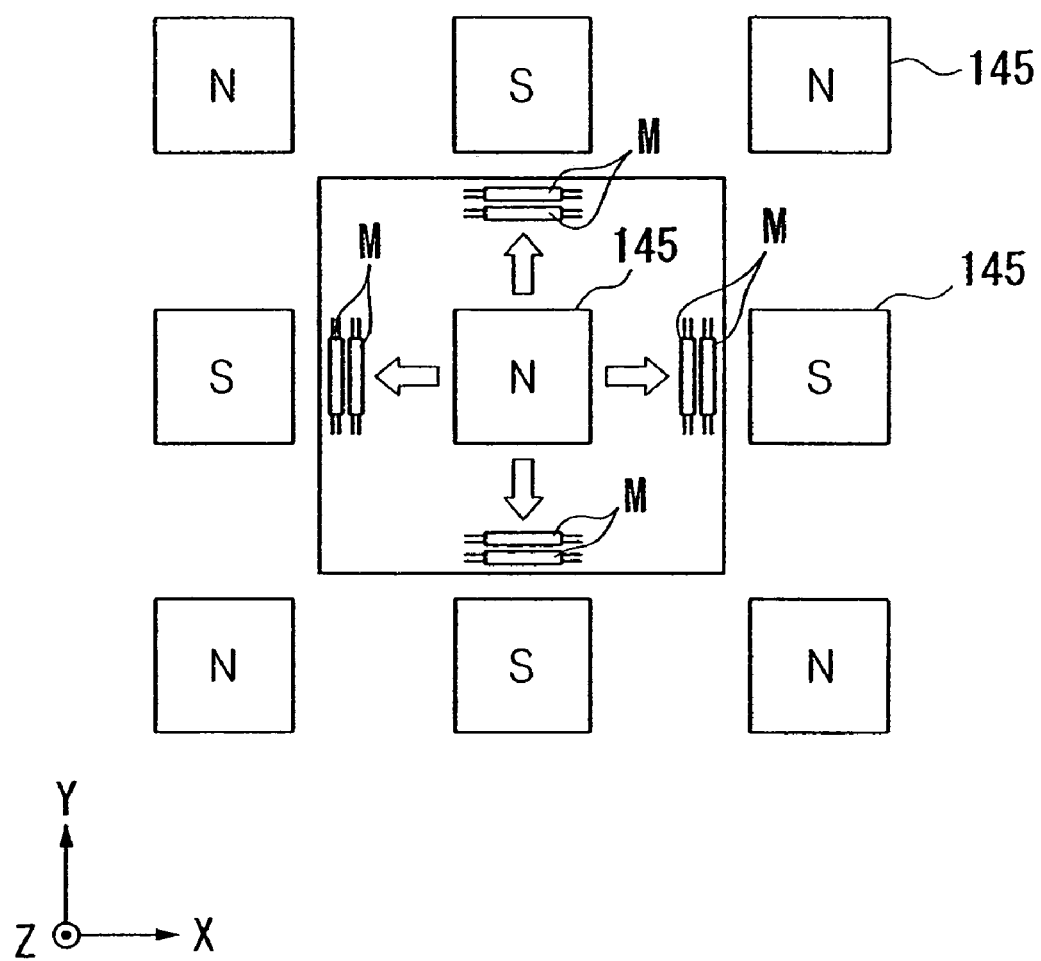
FIG. 42 is a plan view showing the method in which thin magnetic films are magnetized under influences of permanent magnets in the manufacture of the two-axis magnetic sensor.

Similar to the foregoing magnetic sensor 101 in which the quartz glass 141 and the plate 151 are fixed together using the fixing members 155 such as clips (see FIG. 40), the quartz glass 41 is fixed using the fixing members 155 as shown in FIG. 11B.

In the aforementioned magnet array, both of the $Ni_{42}Fe_{58}$ alloy and tungsten (W) are close to silicon (Si) in terms of thermal expansion coefficient; therefore, even when a thermal expansion is caused to occur due to heating, there is no possibility of causing positional deviations between the substrate 46 and the metal plate 47; hence, it is possible to improve the positional accuracy of the magnet array. Herein, the metal plate 47 is used as a part of the magnet array and does not need to be removed; hence, it is possible to improve the holding accuracy of the permanent magnets 45, and it is therefore possible to manufacture the magnetic sensor 1 with ease.

2. Second Embodiment

Figure 12:
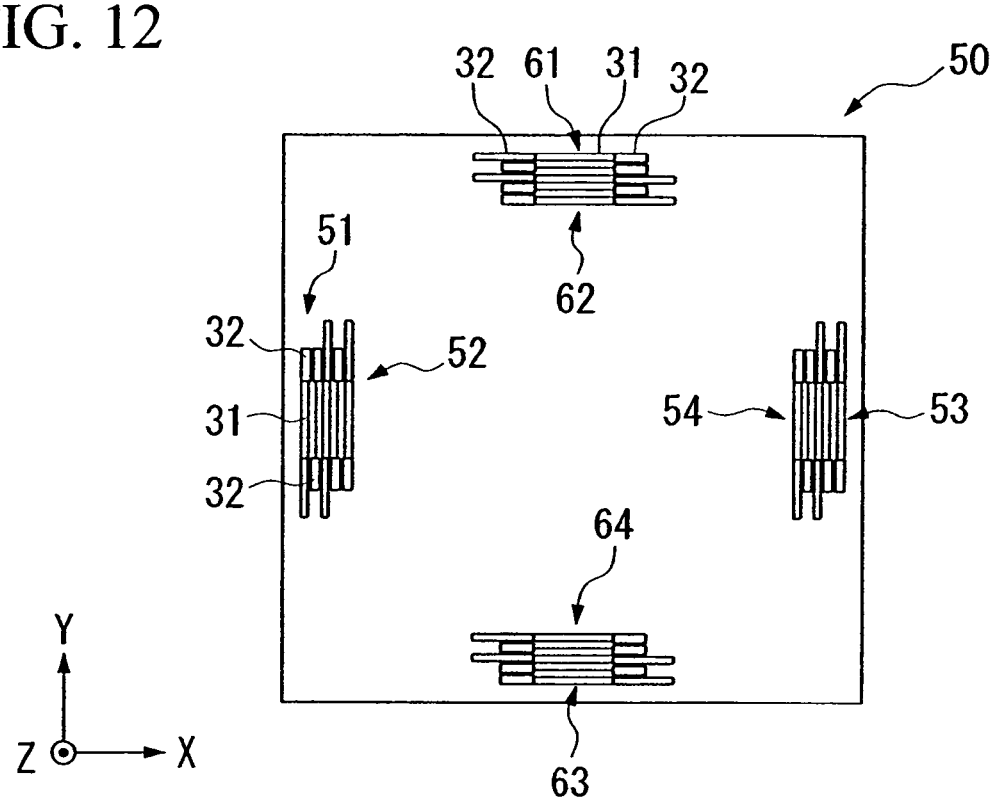
FIG. 12 is a plan view showing a magnetic sensor in accordance with a second embodiment of the invention.

FIG. 12 is a plan view showing a magnetic sensor 50 in accordance with a second embodiment of the invention, wherein GMR elements are arranged along the four sides of a quartz substrate 2, and each of them is constituted by magnetoresistive elements 31 and permanent magnet films 32. The magnetic sensor 50 of the second embodiment differs from the magnetic sensor 1 of the first embodiment in that the longitudinal direction of each magnetoresistive element 31 lies parallel to the proximate side of the quartz substrate 2.

Specifically, the magnetic sensor 2 comprises the 'roughly square-shaped' quartz substrate 2 having a prescribed thickness as well as X-axis GMR elements 51-54 and Y-axis GMR elements 61-64 that are formed on the quartz substrate 2, wherein the X-axis GMR elements 51-54 form an X-axis magnetic sensor for detecting a magnetic field in the X-axis direction, and the Y-axis GMR elements 61-64 form a Y-axis magnetic sensor for detecting a magnetic field in the Y-axis direction.

In the above, the X-axis GMR elements 51-54 are paired and respectively arranged in proximity to the midpoints of two sides of the quartz substrate 2 perpendicular to the X-axis in such a way that the two pairs of them are arranged in parallel with each other. Similarly, the Y-axis GMR elements 61-64 are paired and respectively arranged in proximity to the midpoints of the other two sides of the quartz substrate 2 perpendicular to the Y-axis in such a way that the two pairs of them are arranged in parallel with each other.

Each of the X-axis GMR elements 51-54 and the Y-axis GMR elements 61-64 is constituted by magnetoresistive elements 31, each of which is roughly shaped as a parallelogram and comprises band-shaped spin valve films arranged in parallel with each other, and permanent magnet films 32 that are connected with both ends of the magnetoresistive element 31 in the longitudinal direction, and each of which is made by a roughly square-shaped thin film composed of a hard ferromagnetic substance such as CoCrPt having a high coercive force and a high squareness ratio, wherein the magnetoresistive elements 31 and the permanent magnet films 32 are arranged such that the longitudinal directions thereof conform with each other.

Each of the magnetoresistive elements 31 is formed such that the longitudinal direction thereof lies in parallel with the proximate side of the quartz substrate 2. In addition, each of the permanent magnet films 32 is formed such that the longitudinal direction thereof lies in parallel with the proximate side of the quartz substrate 2, wherein the 'paired' permanent magnet films 32, which are connected with both ends of the same magnetoresistive element 31, are arranged with the same distance from the proximate side of the quartz substrate 2.

In the above, the magnetization direction of the pinned layer is inclined by 45° relative to the longitudinal direction of the magnetoresistive element 31, whereas the magnetization direction of the permanent magnet film 32 lies along the longitudinal direction of the permanent magnet film 32. That is, the magnetization direction of the pinned layer of the magnetoresistive element 31 forms a prescribed angle of 45° relative to the magnetization direction of the permanent magnet film 32.

Similar to the magnetic sensor 1 of the first embodiment, the structure of the spin valve film adapted to each of the X-axis GMR elements 51-54 and the Y-axis GMR elements 61-64 is identical to the structure of the foregoing spin valve film 131 adapted to each of the X-axis GMR elements 111-114 and the Y-axis GMR elements 121-124; hence, the detailed description regarding the structure of the spin valve film will be omitted.

In each of the X-axis GMR elements 51-54 and the Y-axis GMR elements 61-64, the longitudinal direction of the pinned layer PD of the magnetoresistive element 31 matches the longitudinal direction of the permanent magnet film 32. Herein, the magnetization direction of the pinned layer PD is inclined by 45° relative to the longitudinal direction of the magnetoresistive element 31. That is, the magnetization direction of the pinned layer PD of the magnetoresistive element 31 forms a prescribed angle of 45° relative to the magnetization direction of the permanent magnet film 32.

Next, a manufacturing method of the magnetic sensor 50 will be described in detail.

The second embodiment is characterized by using two types of magnet arrays. That is, similar to the magnetic sensor 1 of the first embodiment, spin valve films are formed on a rectangular-shaped quartz glass in order to form permanent magnet films 32 and individual GMR elements.

Figure 13:
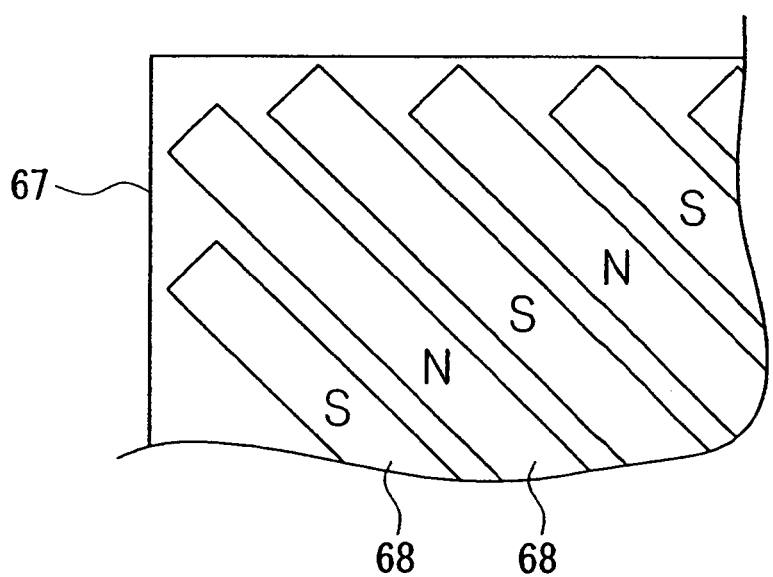
FIG. 13 is a plan view showing a magnet array for use in the magnetic sensor of the second embodiment, in which a plurality of bar magnets are arranged in parallel.

Next, as shown in FIG. 13, there is prepared a first metal plate 67 having a rectangular shape in which a plurality of through holes 43 each having a rectangular-shaped opening are slanted by 45° and are arranged in parallel with each other, wherein a plurality of bar magnets 68 made of rectangular-parallelopiped permanent magnets whose cross-sectional shapes substantially match the opening shapes of the through holes 43 are respectively inserted into the through holes 43 in such a way that the upper end surfaces thereof are arranged substantially in the same plane in parallel with the surface of the first metal plate 67, and the adjoining bar magnets 68 differ from each other in polarity.

Thereafter, similar to the first embodiment, there is provided a first plate made of a transparent quartz glass whose shape substantially matches the shape of the first metal plate 67, wherein the upper end surfaces of the bar magnets 68 that are arranged in parallel with each other in the magnet array are adhered to the lower surface of the first plate by using a prescribed adhesive. At this time, alignment marks are used to establish prescribed positioning between the first plate and the bar magnets 68.

Next, the first metal plate 67 is removed so as to produce a magnet array in which the bar magnets 68 are arranged in parallel with each other, and the adjoining bar magnets 68 differ from each other in polarity.

There is arranged a quartz substrate that is brought into contact with the upper surface of the first plate. That is, a prescribed positioning between the aforementioned quartz glass 41 and the first plate is established by mutually matching their alignment marks together. Next, a plurality of fixing members such as clips are used to fix the quartz glass 41 and the first plate together.

The aforementioned magnet array in which the bar magnets 68 are arranged in parallel with each other results in good accuracy because even when they are unexpectedly shifted in position and in distance therebetween, the magnetization directions thereof would not be deviated so that no dispersion occurs in an ordering heat treatment.

Similar to the first embodiment, the second embodiment can be designed so as to provide a substrate composed of a $Ne_{42}Fe_{58}$ alloy, and a metal plate composed of tungsten (W) in which a plurality of through holes conform with the exterior shapes of the bar magnets 68, wherein the substrate and the metal plate are adhered together so that the bar magnets 68 are respectively inserted into the through holes.

As the magnet array, it is possible to use various types of magnet arrays, other than the aforementioned magnet array, as follows:

(1) A magnet array in which bar magnets each having a different polarity are alternately arranged.

Figure 14A:
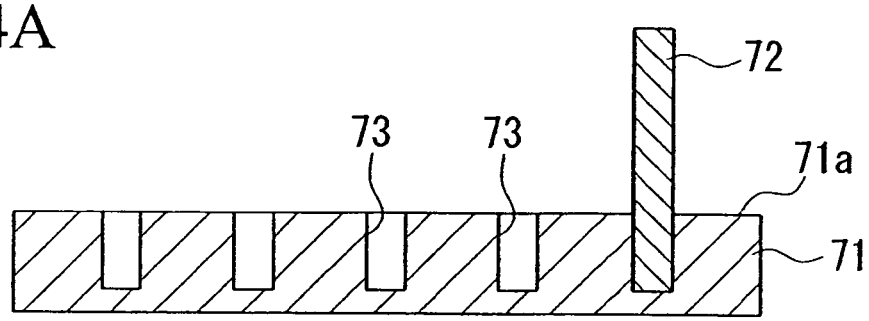
FIG. 14A is a cross sectional view showing a silicon substrate in which slots are formed in parallel with each other in the manufacture of a modified example of a magnet array for use in the magnetic sensor of the second embodiment.

As shown in FIG. 14A, a dicing saw 72 is used to form a plurality of slots 73, which are arranged in parallel with each other with a prescribed distance therebetween, on a surface (or a main surface) 71a of a silicon (Si) substrate 71. Each of the slots 73 has a prescribed width that is substantially identical to the width of the bar magnet 68 inserted therein and is substantially identical to the width of the dicing saw 72. Similar to the aforementioned magnet array, the distance between the adjacent slots 73 is set to half of the length of the diagonal line of the quartz substrate 2.

Figure 14B:
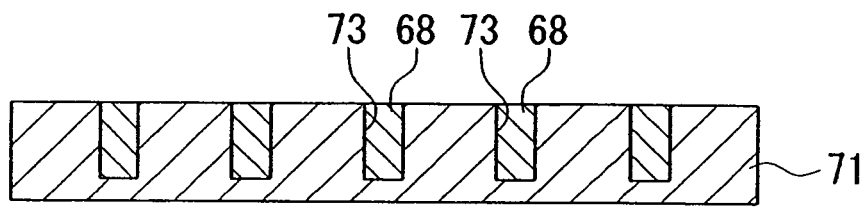
FIG. 14B is a cross sectional view showing the magnet array in which bar magnets are respectively inserted into the slots of the silicon substrate.
Figure 15:
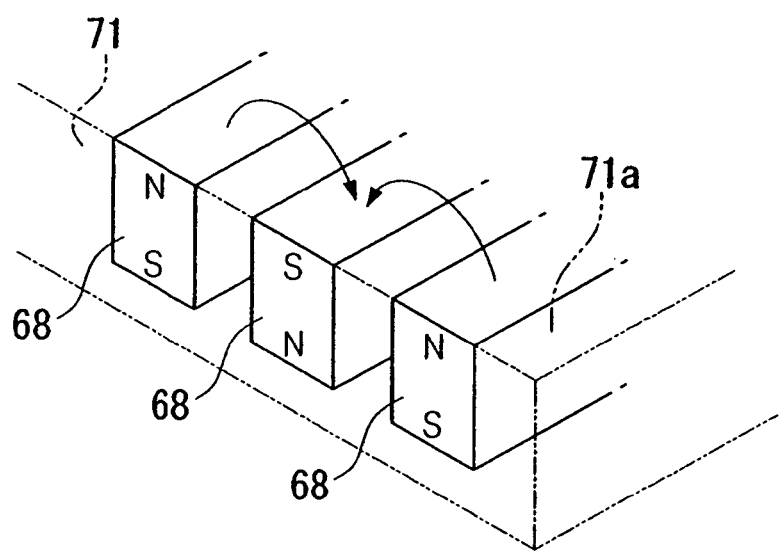
FIG. 15 is a partial perspective view in cross section showing an arrangement of the bar magnets of different polarities inserted into the slots of the silicon substrate.

Then, as shown in FIG. 14B, the bar magnets 68 are respectively inserted into the slots 73 in such a way that the adjoining bar magnets 68 differ from each other in polarity. In this case, the bar magnets 68 are arranged and exposed on the surface 71a of the silicon substrate 71 in such a way that as shown in FIG. 15, the adjoining bar magnets 68 differ from each other in polarity, whereby poles N, S, N, ... are sequentially arranged. As described above, it is possible to produce a magnet array in which the bar magnets 68 each having a different polarity are alternately arranged in the silicon substrate 71.

Figure 16:
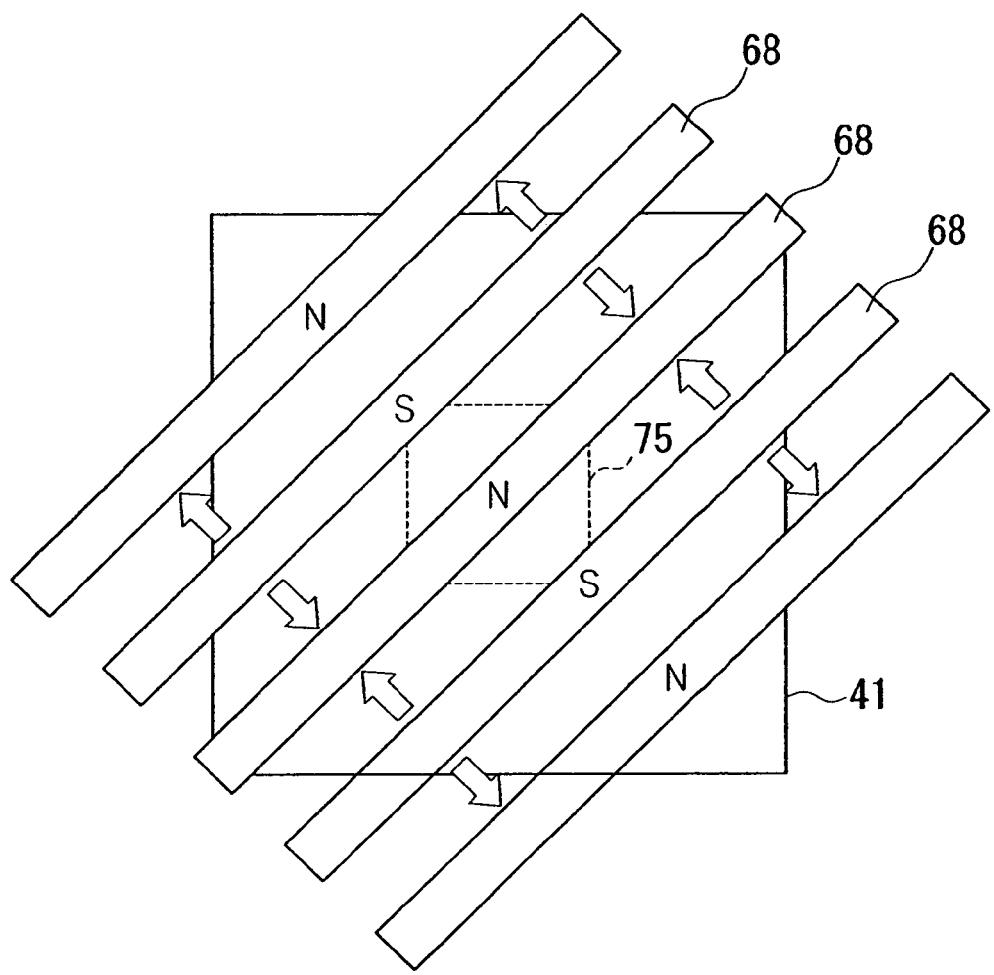
FIG. 16 is a plan view showing the positional relationships between the bar magnets of different polarities and a quartz substrate derived from a quartz glass.

In the aforementioned magnet array, the distance between the adjacent bar magnets 68 is set to half of the length of the diagonal line of the quartz substrate 2. Therefore, when the magnet array is mounted on the quartz glass 41 in such a way that, as shown in FIG. 16, a single bar magnet 68 is arranged to match the diagonal line of each single cell 75 (i.e., a region corresponding to the quartz substrate 2 divided in the subsequent cutting process), its 'adjoining' bar magnets 68 are positioned at opposite corners of the cell 75 to be symmetrical with the diagonal line.

(2) A magnet array in which bar magnets of the same polarity are arranged in parallel with each other.

Figure 17A:
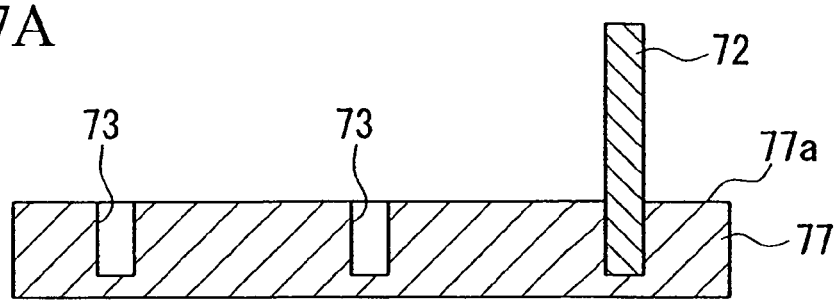
FIG. 17A is a cross sectional view showing a substrate in which slots are formed in parallel with each other in the manufacture of a modified example of a magnet array for use in the magnetic sensor of the second embodiment.

As shown in FIG. 17A, a dicing saw 72 is used to form a plurality of slots 73, which are arranged in parallel with each other with a prescribed distance therebetween, on a surface (or a main surface) 77a of a $Ni_{42}Fe_{58}$ alloy substrate 77, wherein the slot 73 has a prescribed width that is roughly set identical to the width of the bar magnet 68 inserted therein. The distance between the 'adjacent' slots 73 are substantially set identical to the length of the diagonal line of the quartz substrate 2.

Figure 17B:
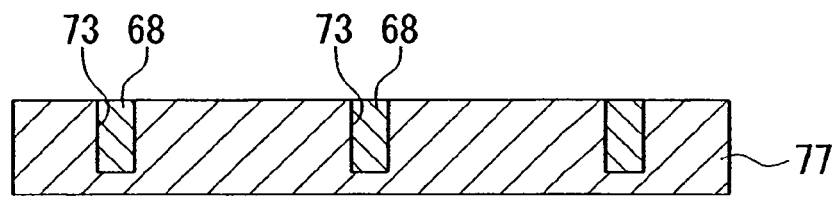
FIG. 17B is a cross sectional view showing the magnet array in which bar magnets are respectively inserted into the slots of the substrate.
Figure 18:
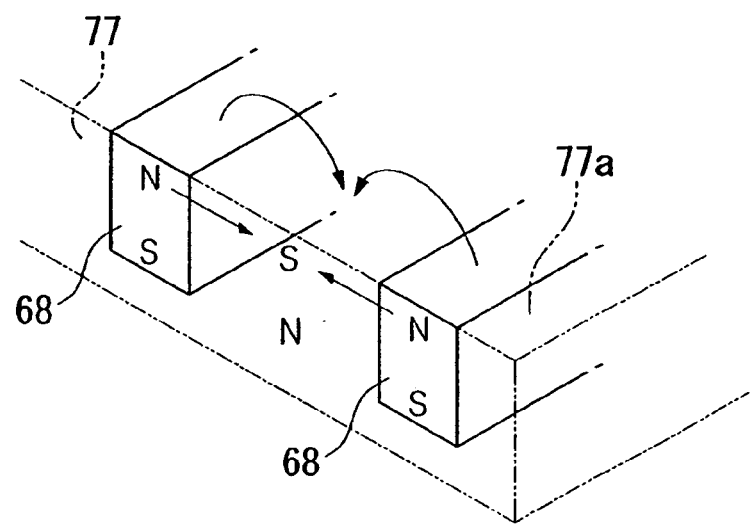
FIG. 18 is a partial perspective view in cross section showing an arrangement of the bar magnets of the same polarity inserted into the slots of the substrate.

Next, as shown in FIG. 17B, the bar magnets 68 are respectively inserted into the slots 73 of the substrate 77 in such a way that all the adjoining bar magnets 68 have the same polarity. In this case, all the bar magnets 68 are arranged with the same polarity on the surface 77a of the $Ni_{42}Fe_{58}$ alloy substrate 77, whereby the same polarity 'N' appears in turn on the surface 77a as shown in FIG. 18.

In the above, an intermediate portion of the $Ni_{42}Fe_{58}$ alloy substrate 77 between the adjacent bar magnets 68 having the same polarity 'N' on the surface 77a has an inverse polarity, that is, polarity 'S'. That is, it apparently seems as if different polarities N, S, N, ... are sequentially arranged in a prescribed direction (i.e., a direction from the left to the right in FIG. 18) in parallel upon a parallel arrangement of the bar magnets 68 with a prescribed distance therebetween, which is substantially identical to half of the length of the diagonal line of the quartz substrate 2.

As described above, it is possible to produce a magnet array in which the bar magnets 68 having the same polarity are arranged in parallel with each other in the $Ni_{42}Fe_{58}$ alloy substrate 77.

Figure 19:
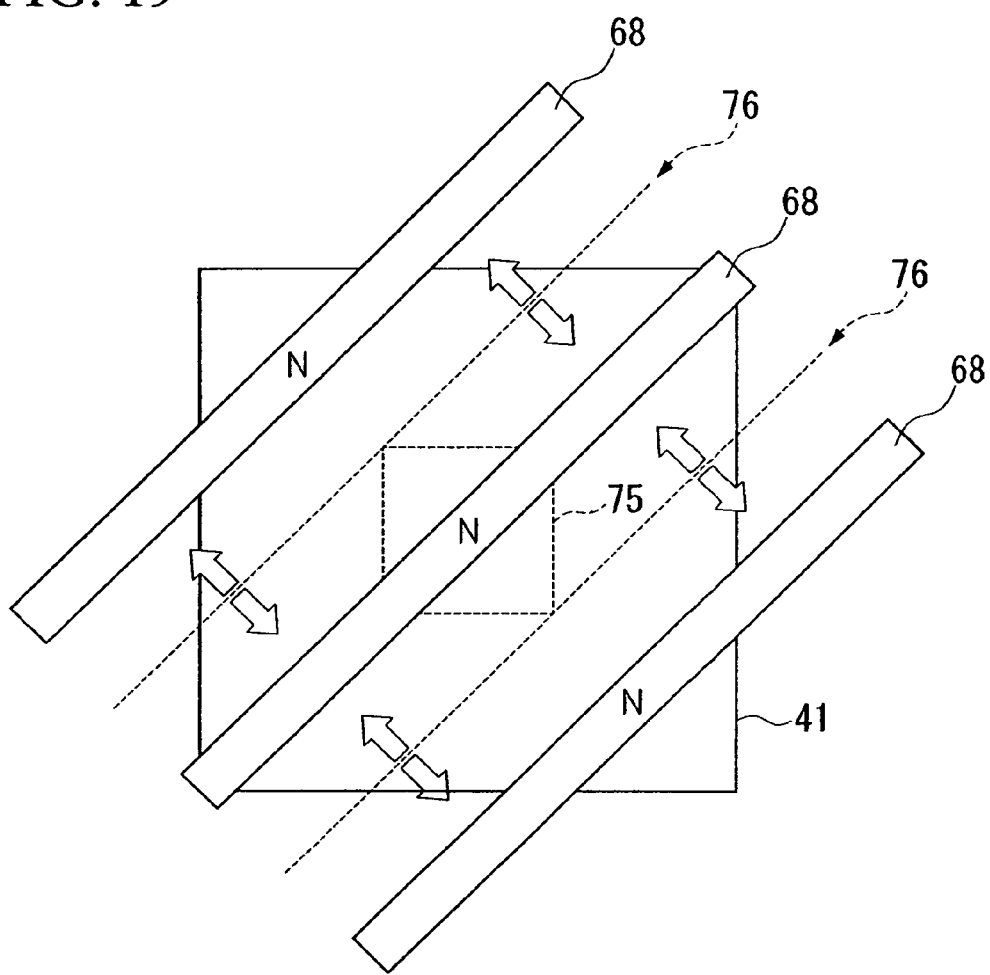
FIG. 19 is a plan view showing the positional relationships of the bar magnets of the same polarity and a quartz substrate.

In the aforementioned magnet array, the distance between the adjacent bar magnets 68 is set to be identical to the length of the diagonal line of the quartz substrate 2. That is, when the magnet array is mounted on the quartz glass 41 in such a way that a single bar magnet 68 is arranged on the diagonal line of a single cell 75 as shown in FIG. 19, each of the corners of the cell 75 that lie symmetrically with respect to the diagonal line matches a line segment 76 that is drawn at a position equally dividing the distance between the adjacent bar magnets 68. Herein, each of the positions of the line segments 76 that respectively cross the opposite corners of the cell 75 and are drawn to be symmetric with respect to the diagonal line of the cell 75 corresponds to a different polarity (i.e., 'S') that differs from the polarity 'N' of the bar magnet 68. That is, it apparently seems as if magnets having the polarity 'S' are arranged on the corners of the cell 75.

In the aforementioned magnet array, it is possible to reliably prevent the bar magnets 68 from attracting each other and falling over or from unexpectedly rotating by themselves. Therefore, it is possible to fix the bar magnets 68, which cannot be fixed using a thin metal plate, at prescribed positions with ease and with good accuracy.

Thereafter, the pinning layer PN within the pin layer of the magnetoresistive element 31 is subjected to an ordering heat treatment.

Figure 20:
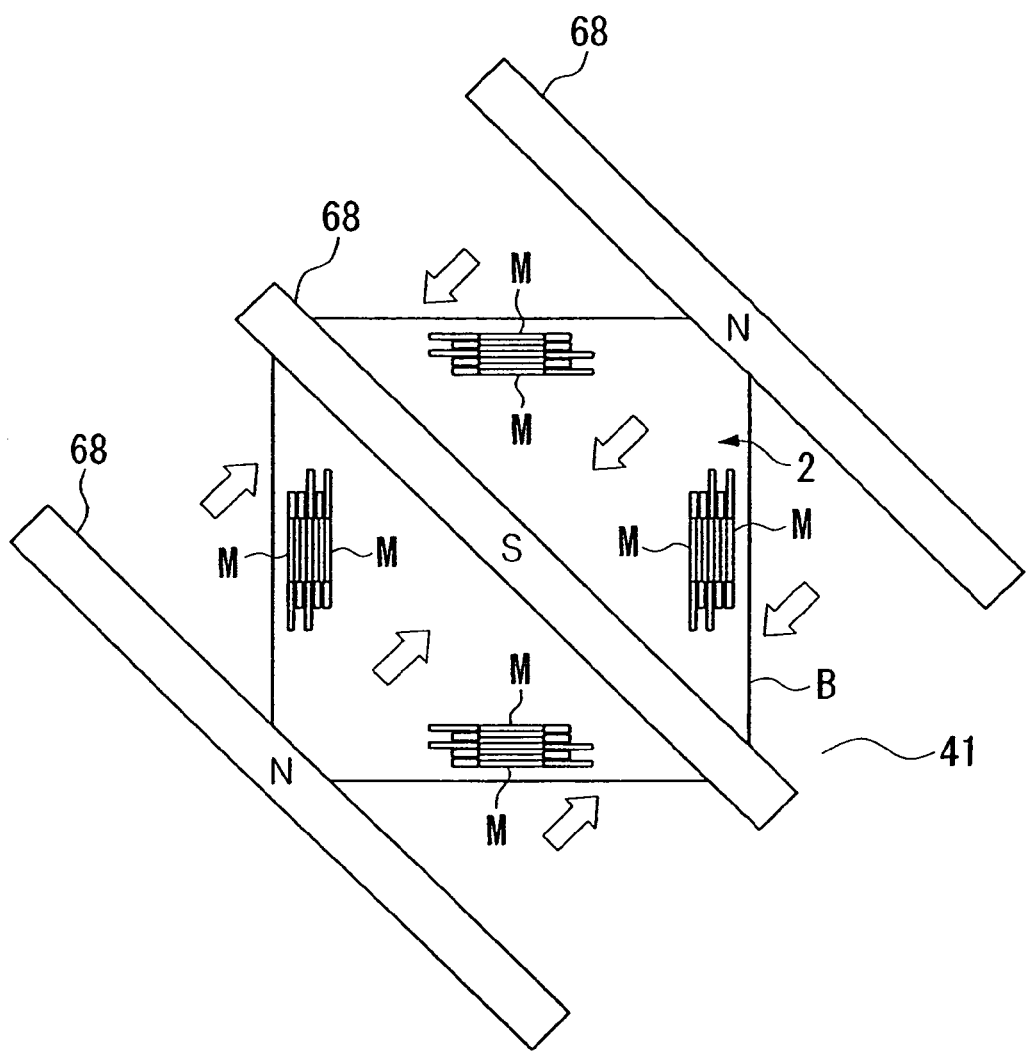
FIG. 20 is a plan view showing a quartz glass on which GMR elements and bar magnets are arranged in the manufacture of a magnetic sensor in accordance with a second embodiment of the invention.

First, as shown in FIG. 20, three bar magnets 68 are arranged with a prescribed distance therebetween to be inclined by 45° relative to a prescribed side of the quartz glass 41 in such a way that the adjoining bar magnets 68 differ from each other in polarity.

In this case, a prescribed magnetic field is established in a direction from one adjacent bar magnet 68 to the other, wherein the magnetic field is inclined by 45° relative to the prescribed side of the quartz substrate 2, so that a magnetic field is applied in a direction inclined by 45° with respect to the longitudinal direction of each spin valve film M.

Next, the quartz glass 41 and the aforementioned plate are fixed together using the fixing members, and are subjected to a heat treatment under a vacuum state for four hours at a prescribed temperature ranging from 250° C. to 280° C., for example.

Figure 21:
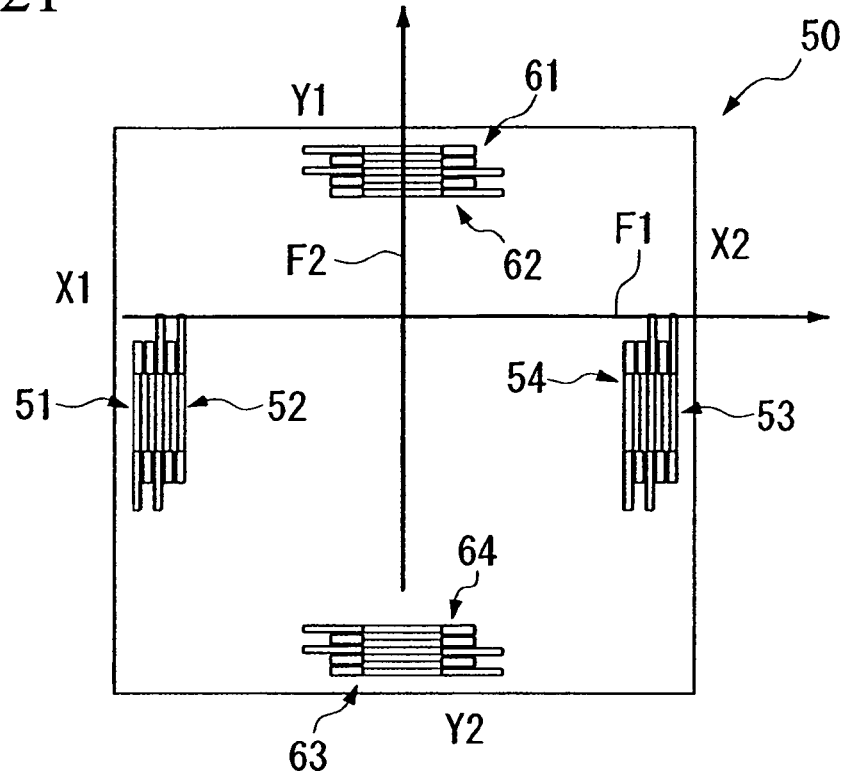
FIG. 21 is a plan view showing an arrangement of the GMR elements of the magnetic sensor of the second embodiment in connection with X-axis and Y-axis sensing directions.

Thus, it is possible to perform an ordering heat treatment on the pinning layers of the magnetoresistive elements 31 incorporated in each of the X-axis GMR elements 51-54 and the Y-axis GMR elements 61-64. Then, similar to the first embodiment, the spin valve layers are subjected to patterning. As a result, it is possible to produce the magnetic sensor 50 in which the X-axis sensing direction F1 and the Y-axis sensing direction F2 lie in the pinned layers P of the magnetoresistive elements 31 as shown in FIG. 21.

Figure 22:
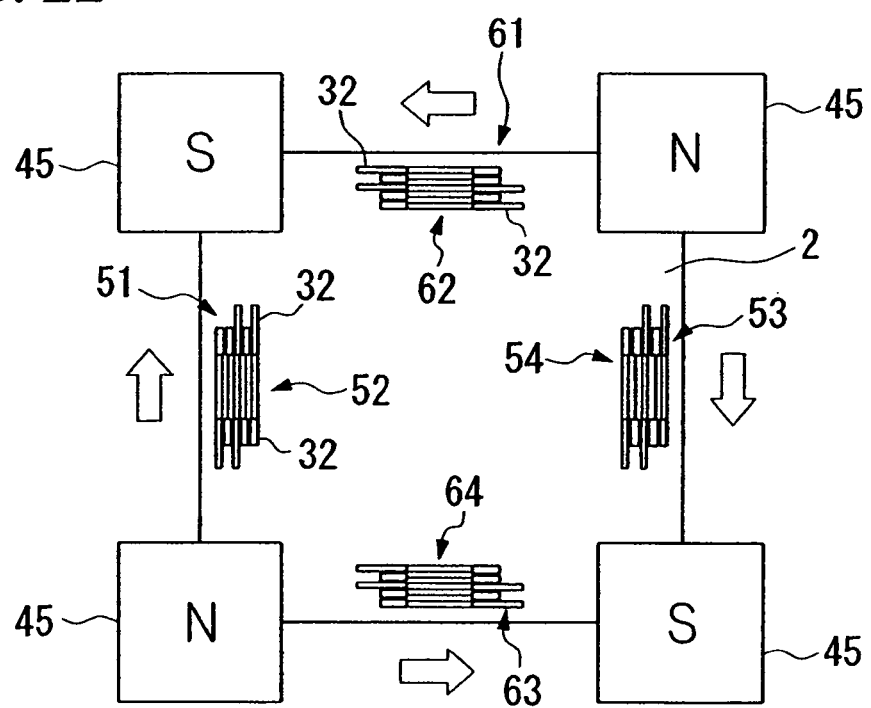
FIG. 22 is a plan view showing an arrangement of permanent magnets relative to the GMR elements formed on the quartz substrate for use in the manufacture of the magnetic sensor of the second embodiment.

Thereafter, as shown in FIG. 22, a magnet array whose constitution is similar to the constitution of the magnet array used in the first embodiment is used to magnetize the permanent magnet films 32.

In the above, similar to the first embodiment, the permanent magnets 45 are arranged on the four corners of the quartz substrate 2, which is divided by the subsequent cutting process, in such a way that the adjoining permanent magnets 45 differ from each other in polarity, whereby a magnetic field is established from one permanent magnet 45 of the N pole to the other permanent magnet 45 of the S pole. This magnetic field is effected in parallel with each single side of the quartz substrate 2; hence, it is possible to establish a magnetic field in a direction substantially matching the longitudinal direction of each permanent magnet film 32.

As described above, it is possible to produce the magnetic sensor 50 in which the free layers F of the pin layers of the magnetoresistive elements 31 are initialized in magnetization, and the permanent magnets films 32 are adequately magnetized.

The magnetic sensor 50 of the second embodiment employs the same bridge connection adapted to the magnetic sensor 1 of the first embodiment. In short, the second embodiment can offer the same effects realized in the aforementioned first embodiment.

3. Third Embodiment

The second embodiment uses the magnet array whose constitution is identical to the constitution of the magnet array used in the first embodiment so as to adequately attach the permanent magnets 45 and to magnetize the permanent magnet films 32. Herein, the magnetization of the permanent magnet films 32 can be realized directly using the aforementioned magnet array that is used in the ordering heat treatment in the second embodiment without changing the arranging positions of the magnets.

In this magnetization, a magnetic field is established along the diagonal line of the quartz substrate 2, which is divided in the subsequent cutting process, and in a direction inclined by 45° relative to one side of the quartz substrate 2. Therefore, a magnetic field is applied to the permanent magnet film 32 whose longitudinal direction is set in parallel with one side of the quartz substrate 2 in a direction 45° inclined relative to the longitudinal direction of the permanent magnet 32.

In this case, the terminal end of the free layer F is initialized in a direction identical to the magnetization direction of the permanent magnet film 32. In general, the initialization direction of the free layer F is aligned in the longitudinal direction due to shape anisotropy. For this reason, each of the GMR elements is initialized in magnetization along the longitudinal direction thereof, which is set in parallel with a prescribed side of the quartz substrate 2.

As described above, it is possible to produce a magnetic sensor of the third embodiment in which the free layer F of the magnetoresistive element 31 is initialized in magnetization, and the permanent magnet film 32 is adequately magnetized.

The third embodiment allows a small loss at the terminal end of the free layer F, which may slightly deteriorate the sensitivity compared with the second embodiment; however, the third embodiment is designed in such a way that the magnetization direction is set similar to the first embodiment; hence, it is possible to noticeably reduce offset variations even when an intense external magnetic field is applied to the magnetic sensor.

4. Fourth Embodiment

Figure 23:
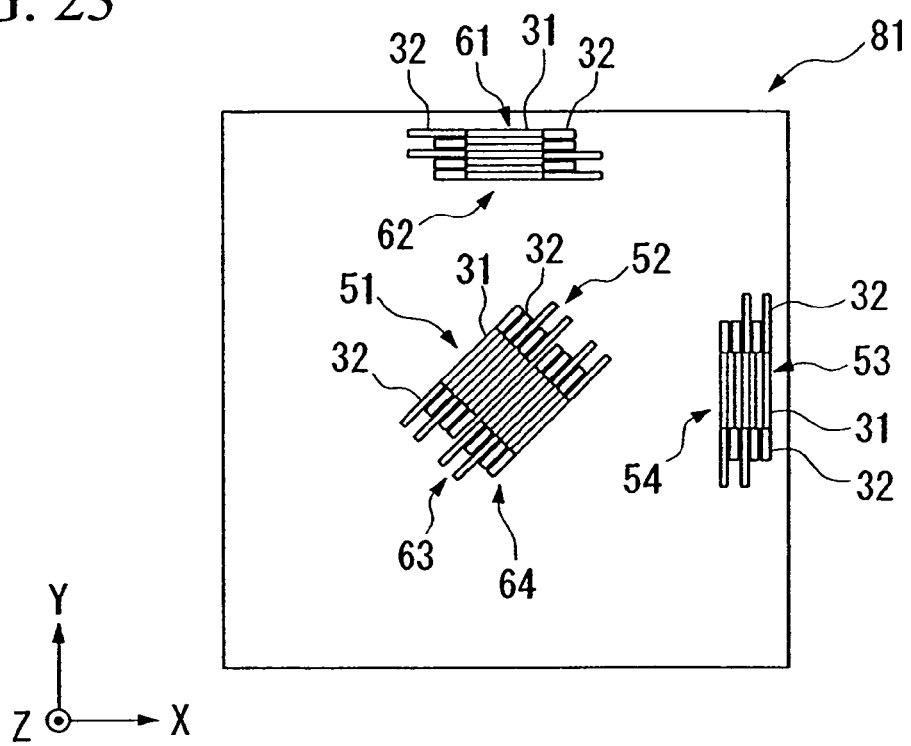
FIG. 23 is a plan view showing a magnetic sensor in accordance with a fourth embodiment of the invention.

FIG. 23 is a plan view showing a magnetic sensor in accordance with a fourth embodiment of the invention, wherein, similar to the aforementioned embodiments, a magnetic sensor 81 of the fourth embodiment is constituted using GMR elements and permanent magnet films formed on a quartz substrate 2. Herein, the magnetic sensor 81 differs from the magnetic sensor 50 of the second embodiment, in which the X-axis GMR elements 51-52 are arranged in parallel with each other in proximity to the midpoint of one side of the quartz substrate 2 lying in the negative direction of the X-axis, and the Y-axis GMR elements 63-64 are arranged in parallel with each other in proximity to the midpoint of the other side of the quartz substrate 2 lying in the negative direction of the Y-axis, such that in order to cancel the sensitivities realized by the X-axis GMR elements 51-52 and the Y-axis GMR elements 63-64, they are arranged substantially in the center of the quartz substrate 2 and are inclined by 45° relative to a prescribed side of the quartz substrate 2.

Figure 24:
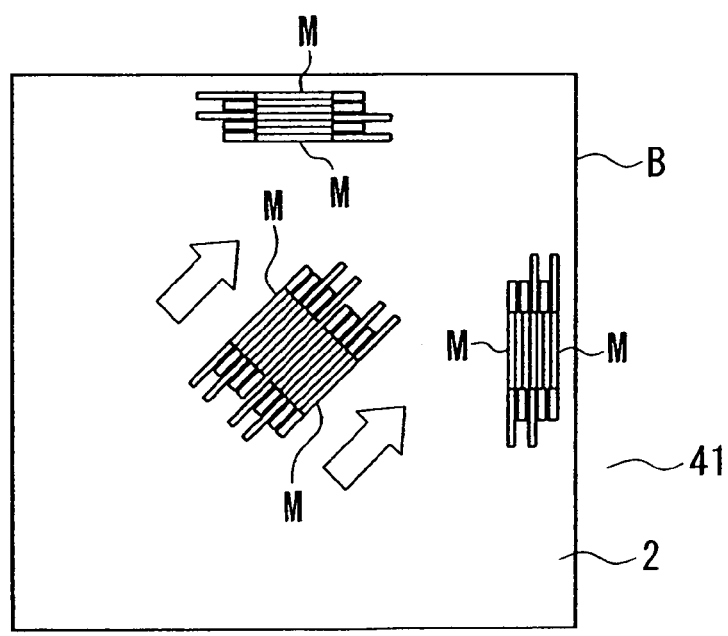
FIG. 24 is a plan view showing an arrangement of GMR elements on a quartz glass in the manufacture of the magnetic sensor of the fourth embodiment.

In the manufacture of the magnetic sensor 81, the pinning layers of the magnetoresistive elements 31 are subjected to an ordering heat treatment in which the quartz glass 41 is heated for four hours in a vacuum state at a prescribed temperature ranging from 250° C. to 280° C., for example, wherein a magnetic field is applied in a direction parallel to the X-axis GMR elements 51-52 and the Y-axis GMR elements 63-64. That is, as shown in FIG. 24, it is preferable that a magnetic field having uniform intensity be applied along the longitudinal directions of the X-axis GMR elements 51-52 and the Y-axis GMR elements 63-64 and in a direction from the lower left to the upper right.

Similar to the aforementioned embodiments, the magnetic sensor 81 is subjected to magnetization by fixing the quartz glass and plate together.

As described above, it is possible to initialize the free layers F of the magnetoresistive elements 31 incorporated in the X-axis GMR elements 51-54 and the Y-axis GMR elements 61-64 and to adequately magnetize the permanent magnet films 32. Thus, it is possible to produce the magnetic sensor 81 in which the pinned layers PD of the magnetoresistive elements 31 and the permanent magnet films 32 are adequately magnetized.

Figure 25:
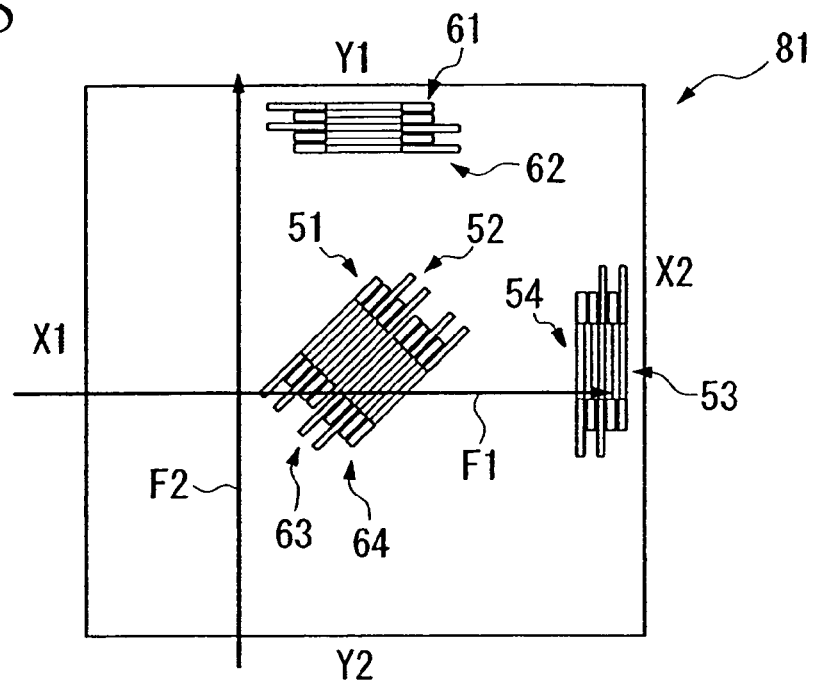
FIG. 25 is a plan view showing sensing directions actualized by the magnetic sensor of the fourth embodiment.
Figure 26:
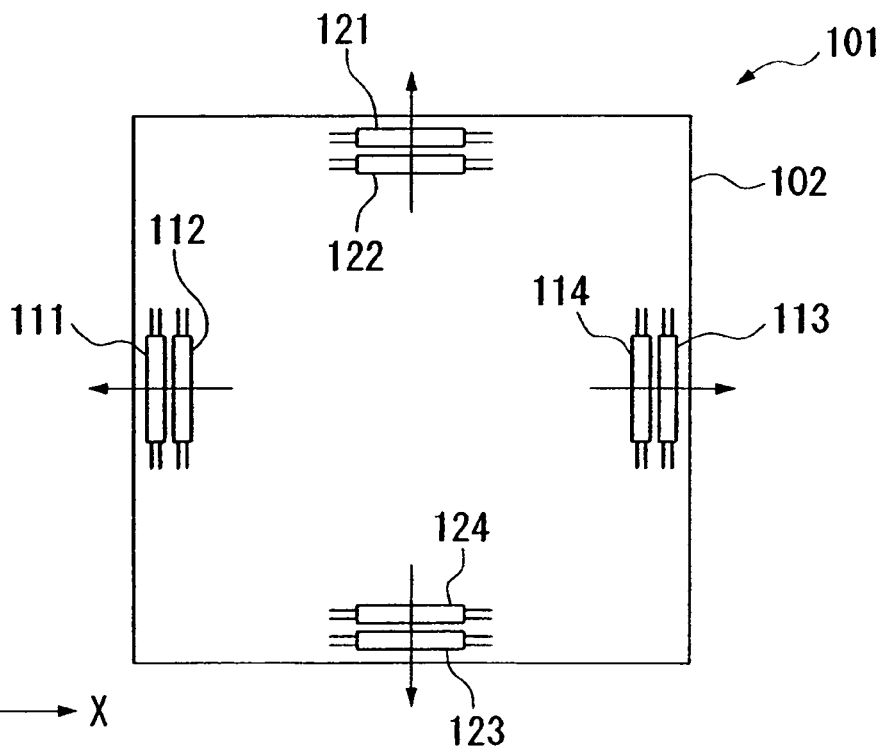
FIG. 26 is a plan view showing a two-axis magnetic sensor using GMR elements.
Figure 27:
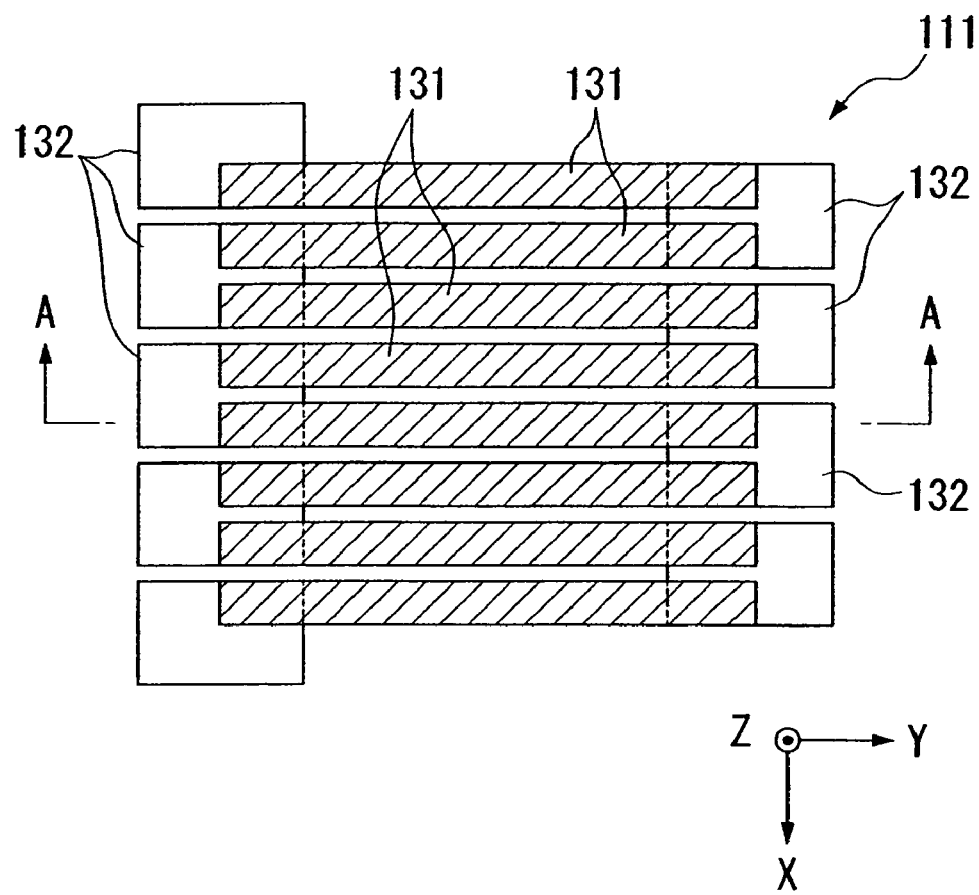
FIG. 27 is a plan view showing the configuration of a GMR element for use in the two-axis magnetic sensor.
Figure 28:
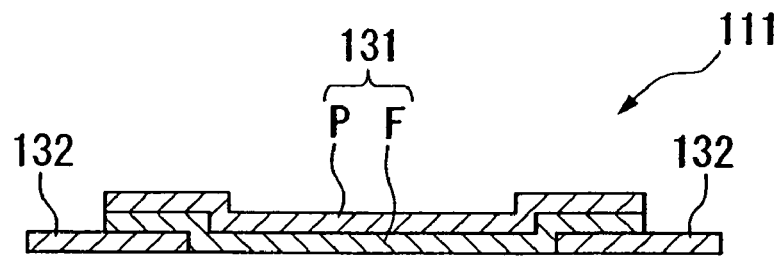
FIG. 28 is a cross sectional view taken along line A-A in FIG. 27.
Figure 29:
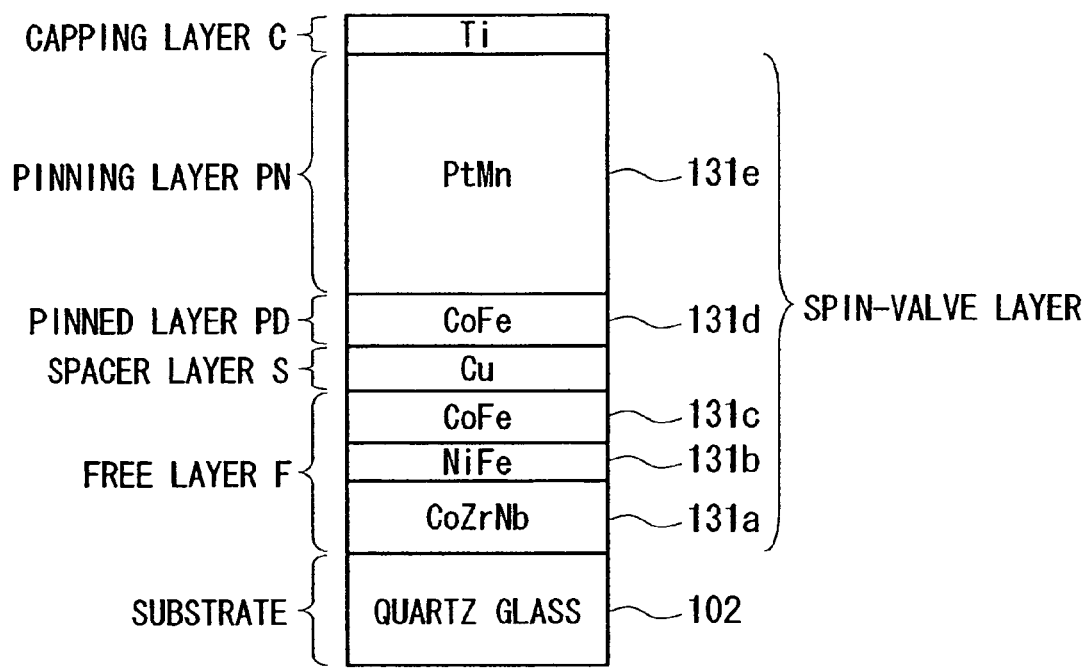
FIG. 29 is a cross sectional view diagrammatically showing the constitution of a spin valve film used in the GMR element shown in FIG. 27.
Figure 30:
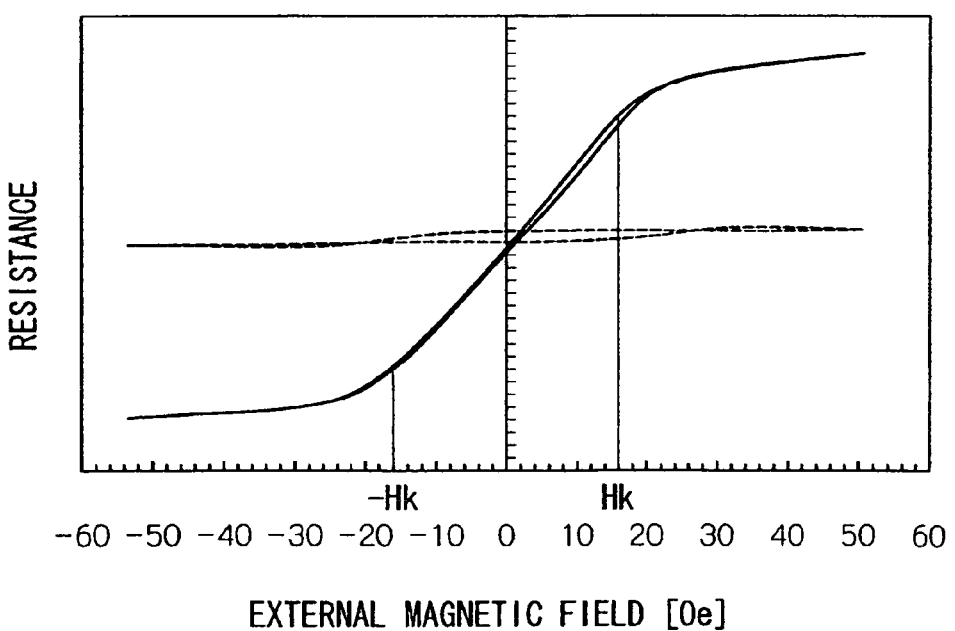
FIG. 30 is a graph showing the magnetic characteristics of the GMR element.
Figure 31:
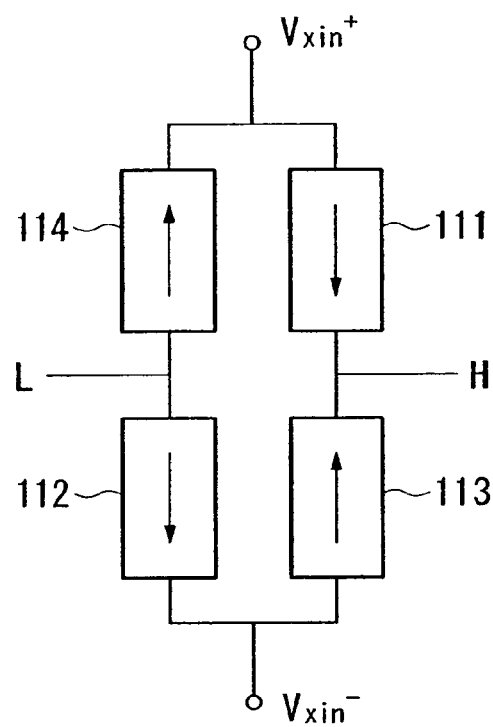
FIG. 31 is a block diagram simply showing a full bridge connection of GMR elements adapted to an X-axis magnetic sensor.
Figure 32:
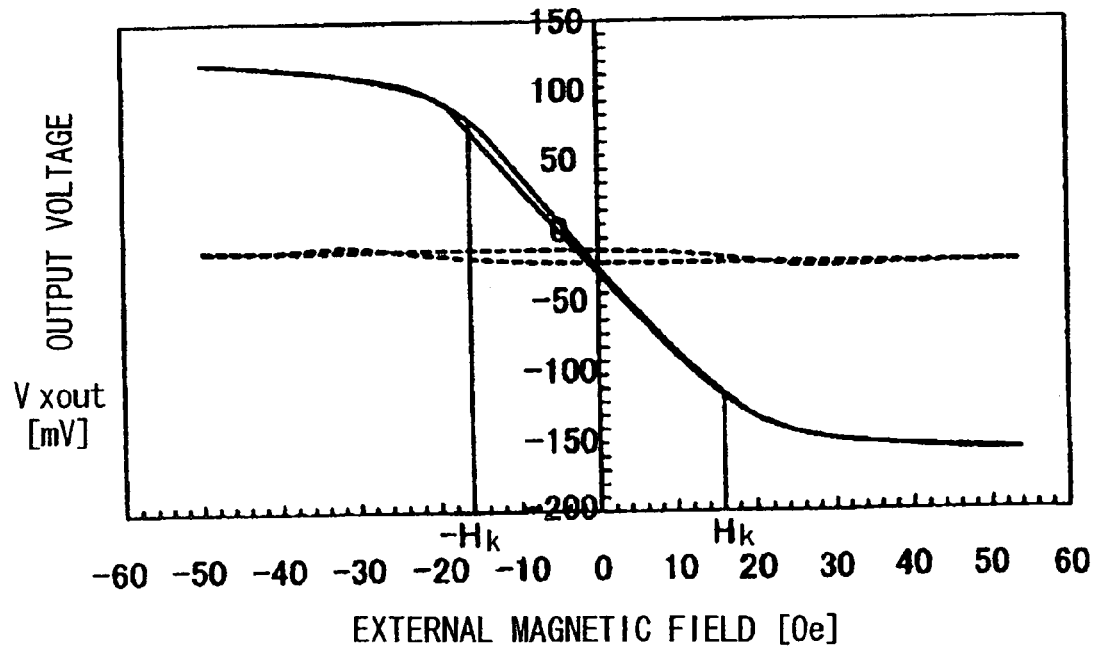
FIG. 32 is a graph showing the magnetic characteristics of the X-axis magnetic sensor.
Figure 33:
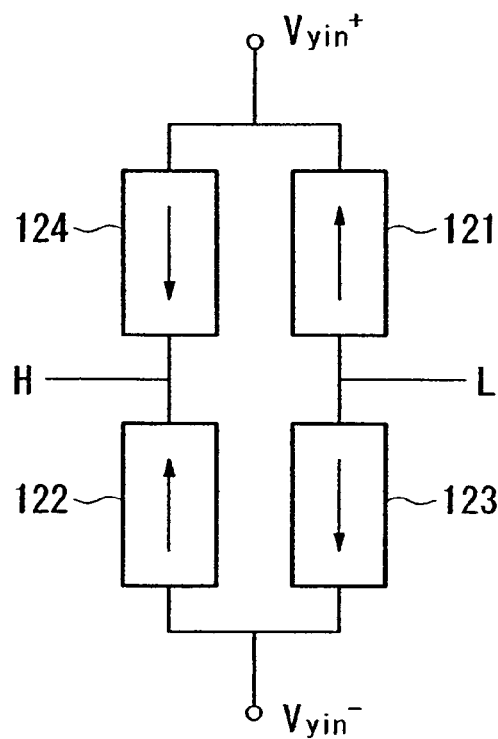
FIG. 33 is a block diagram simply showing a full bridge connection of GMR elements adapted to a Y-axis magnetic sensor.
Figure 34:
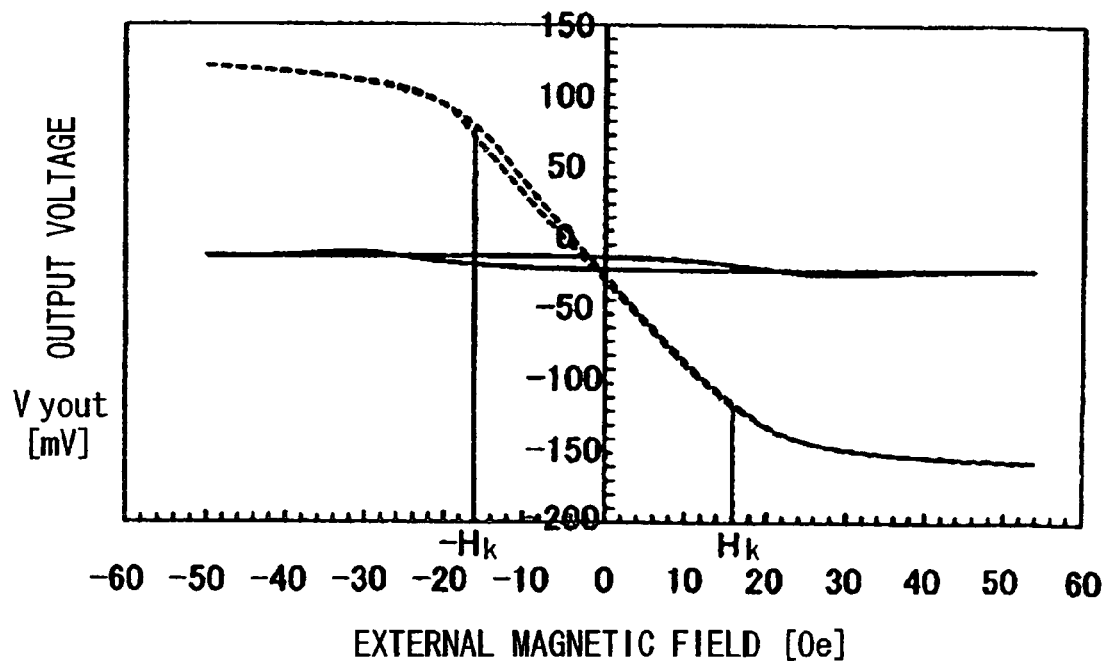
FIG. 34 is a graph showing the magnetic characteristics of the Y-axis magnetic sensor.
Figure 35:
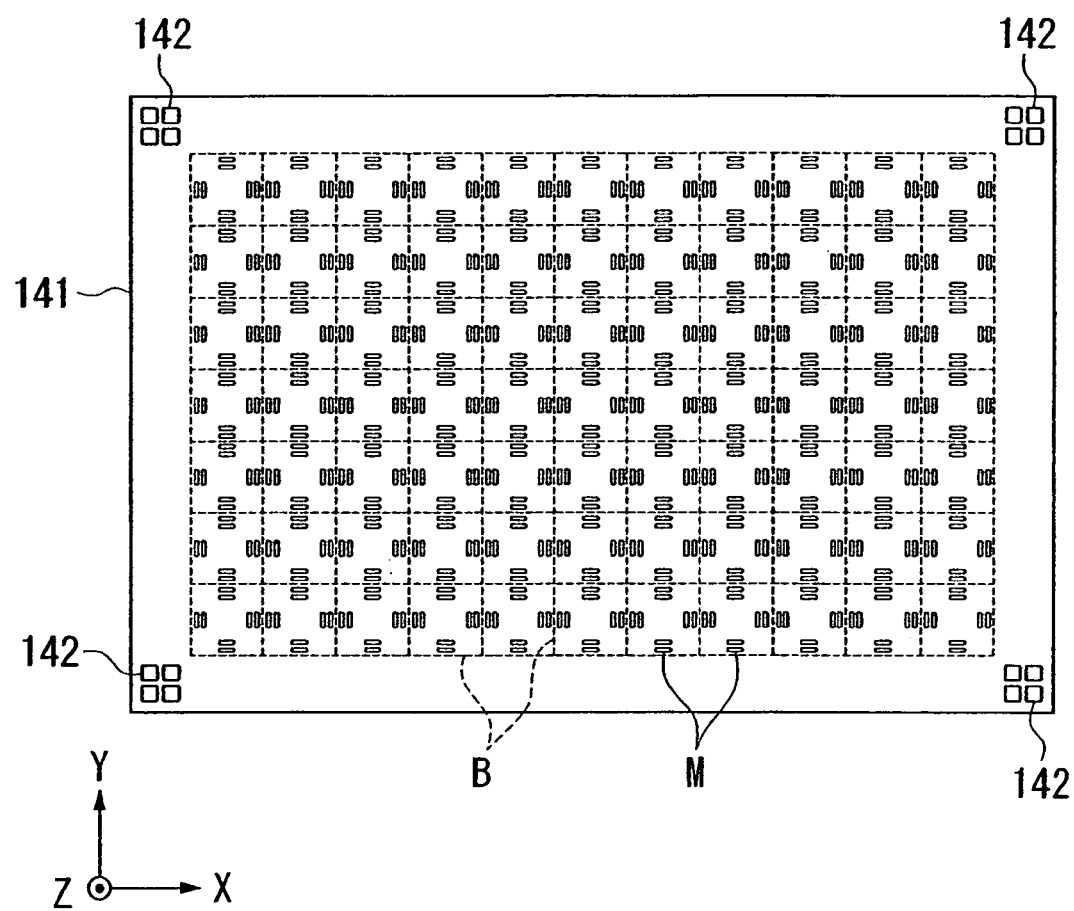
FIG. 35 is a plan view showing the formation of GMR element films on a quartz glass, which is used in the manufacture of the two-axis magnetic sensor.
Figure 36:
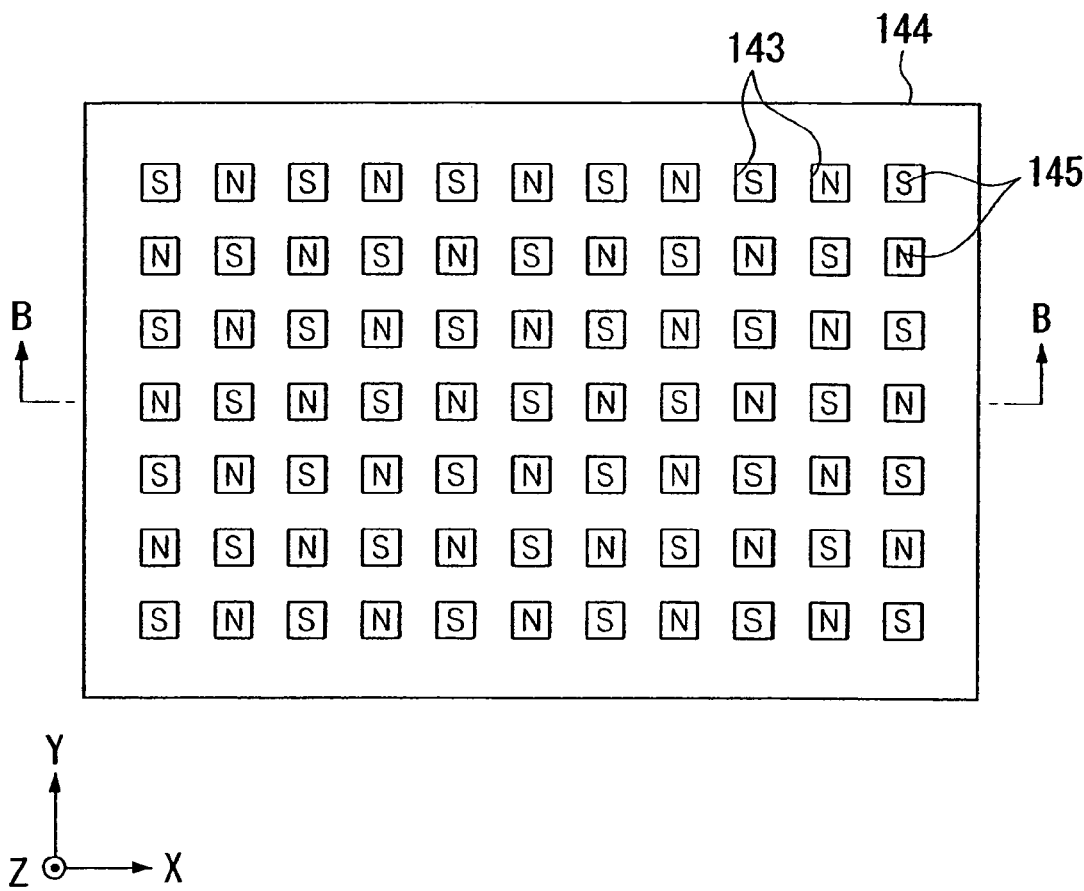
FIG. 36 is a plan view showing a metal plate arranging permanent magnets, which is used to manufacture the two-axis magnetic sensor.
Figure 37:
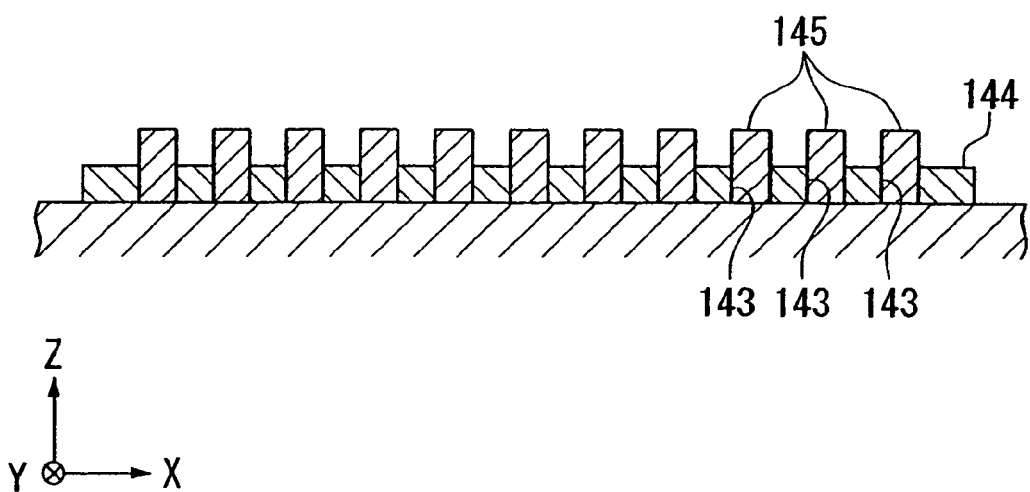
FIG. 37 is a cross sectional view taken along line B-B in FIG. 36.

As shown in FIG. 25, the aforementioned magnetic sensor 81 presents an X-axis sensing direction F1 and a Y-axis sensing direction F2 with respect to the pinned layers PD of the magnetoresistive elements 31, except for the magnetoresistive elements 31 incorporated in the GMR elements 51-52 and 63-64 arranged substantially in the center of the quartz substrate 2.

The bridge connections of the GMR elements incorporated in the magnetic sensor 81 are identical to those of the magnetic sensor 1 of the first embodiment. Therefore, the fourth embodiment can offer effects similar to those of the first embodiment.

5. Fifth Embodiment

The fifth embodiment is basically identical to the fourth embodiment but is characterized in that the aforementioned magnet array is not used but a uniform magnetic field is applied in order to magnetize the permanent magnet films 32 similar to the aforementioned ordering heat treatment.

Herein, the magnetization of the permanent magnet films 32 will be described in detail.

That is, a uniform magnetic field whose intensity is uniform is applied in a direction from the lower left to the upper right in FIG. 24 similar to the aforementioned ordering heat treatment.

With respect to the X-axis GMR elements 53-54, which are arranged in parallel with one side of the quartz glass 41, and the Y-axis GMR elements 61-62, which are arranged in parallel with the other side of the quartz substrate 41, a magnetic field is applied along the diagonal line of the quartz substrate 2, which is divided by the subsequent cutting process, and in a direction inclined by 45° relative to each side of the quartz substrate 2. That is, a magnetic field is applied to each of the permanent magnet films 32 whose longitudinal directions are parallel to prescribed sides of the quartz substrate 2 in a direction inclined by 45° relative to each of the longitudinal directions of the permanent magnet films 32.

The terminal end of the free layer F is initialized in a direction identical to the magnetization direction of the permanent magnet 32, wherein the free layer F is magnetized in the longitudinal direction thereof due to shape anisotropy thereof, so that the free layer F is initialized in magnetization in the longitudinal direction of the corresponding GMR element, that is, along the prescribed side of the quartz glass 41.

The fifth embodiment allows a small loss at the terminal end of the free layer F, which may slightly reduce the sensitivity compared with the sensitivity of the magnetic sensor of the second embodiment; however, the fifth embodiment is designed to realize the same magnetization direction(s) actualized in the first embodiment; hence, it is possible to noticeably reduce offset variations even when an intense external magnetic field is applied to the magnetic sensor.

FIG. 43 shows the results of a comparison between the magnetic sensor of this invention (i.e., Embodiments 1-5) and the foregoing magnetic sensor (i.e., Comparative Example), wherein Embodiment 1 corresponds to the magnetic sensor 1 of the first embodiment; Embodiment 2 corresponds to the magnetic sensor 50 of the second embodiment; Embodiment 3 corresponds to the magnetic sensor of the third embodiment; Embodiment 4 corresponds to the magnetic sensor 81 of the fourth embodiment; and Embodiment 5 corresponds to the magnetic sensor of the fifth embodiment.

FIG. 43 shows that compared with the Comparative Example, all the magnetic sensors of Embodiments 1-5 are superior in the resistant characteristics to an intense magnetic field. In each of Embodiments 1-5 compared with the Comparative Example, it is possible to reduce offset variations after exposure of a magnetic field of 100 Oe, which shows the resistant characteristics to an intense magnetic field.

Each of Embodiments 1-5 may be reduced in sensitivity compared with the Comparative Example in which the longitudinal direction of the GMR element crosses at a right angle to the magnetization direction of the pinned layer realized in the ordering heat treatment; however, it can be said that each of them presents the good resistant characteristics to an intense magnetic field.

In addition, it can be said that, compared with Embodiments 2 and 4 in which the magnetization direction of the permanent magnet film differs from the magnetization direction of the pinned layer realized in the ordering heat treatment, Embodiments 1, 3, and 5, in which the magnetization direction of the permanent magnet film is identical to the magnetization direction realized in the ordering heat treatment, can offer the good resistant characteristics to an intense magnetic field.

In each of Embodiments 1, 3 and 5 in which the magnetization direction of the permanent magnet film does not match the longitudinal direction of the GMR element (i.e., the longitudinal direction of the free layer), the terminal end of the free layer is magnetized in the magnetization direction of the permanent magnet film; hence, a small loss may occur so as to slightly reduce the sensitivity. However, variation ratios with respect to the sensitivity are small because of the 'good' resistant characteristics to an intense magnetic field.

As described heretofore, this invention has a variety of effects and technical features, which will be described below.

(1) A magnetic sensor of this invention is characterized in that the magnetization direction of a pinned layer of a magnetoresistive element forms a prescribed angle of 45° relative to the longitudinal direction of the magnetoresistive element; therefore, even when an intense magnetic field is applied, it is possible to reliably suppress offset variations of the bridge connections of the GMR elements; hence, it is possible to noticeably improve the resistant characteristics to an intense magnetic field.

(2) In addition, it is possible to modify the magnetic sensor in such a way that the magnetization direction of a pinned layer of a magnetoresistive element forms a prescribed angle of 45° relative to the magnetization direction of a permanent magnet film, whereby even when an intense magnetic field is applied, it is possible to reliably suppress offset variations of the bridge connections of the GMR elements; hence, it is possible to noticeably improve the resistant characteristics to an intense magnetic field.

(3) According to a manufacturing method of the magnetic sensor of this invention, an ordering heat treatment is performed using a magnet array in which a plurality of permanent magnets are arranged in such a way that adjoining permanent magnets differ from each other in polarity, wherein a substrate is arranged on the magnet array such that the permanent magnets are positioned to respectively or selectively match the four corners of a cell within the substrate, which is then heated. Herein, the permanent magnet films are magnetized by arranging the substrate on the magnet array without changing the relative positional relationship therebetween; therefore, it is possible to initialize the free layer of the magnetoresistive element and to magnetize the permanent magnet film with ease. As a result, it is possible to produce the magnetic sensor, in which the magnetization direction of the magnetoresistive element forms a prescribed angle of 45° relative to the magnetization direction of the permanent magnet film, by simple processes with ease.

(4) It is possible to modify the manufacturing method in such a way that the ordering heat treatment is performed by heating the substrate in which the magnetization direction of the pinned layer substantially matches the diagonal line of the cell within the substrate, wherein the permanent magnet films are magnetized by arranging the substrate on the magnet array in which adjoining permanent magnets are arranged to differ from each other in polarity, whereby it is possible to initialize the free layer of the magnetoresistive element and to magnetize the permanent magnet film with ease. Thus, it is possible to produce the magnetic sensor, in which the magnetization direction of the pinned layer of the magnetoresistive element forms a prescribed angle of 45° relative to the magnetization direction of the permanent magnet film, by simple processes with ease.

(5) It is possible to further modify the manufacturing method in such a way that the ordering heat treatment is performed by heating the substrate in which the magnetization direction of the pinned layer matches the diagonal line of the cell within the substrate, wherein the permanent magnet films are magnetized by arranging the substrate such that the magnetization direction of the pinned layer substantially matches the diagonal line of the cell, whereby it is possible to initialize the free layer of the magnetoresistive element and to magnetize the permanent magnet film with ease. Thus, it is possible to produce the magnetic sensor, in which the magnetization direction of the pinned layer of the magnetoresistive element forms a prescribed angle of 45° relative to the magnetization direction of the permanent magnet film, by simple processes with ease.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A magnetic sensor comprising:
   a quartz substrate having a roughly square shape;
   a first X-axis GMR element that is arranged in proximity to a first side of the quartz substrate perpendicular to an X-axis and is inclined by a prescribed angle relative to the first side;
   a second X-axis GMR element that is arranged in proximity to a second side of the quartz substrate, which is opposite to the first side and is perpendicular to the X-axis, and is inclined by the prescribed angle relative to the second side;
   a first Y-axis GMR element that is arranged in proximity to a third side of the quartz substrate perpendicular to a Y-axis and is inclined by the prescribed angle relative to the third side;
   a second Y-axis GMR element that is arranged in proximity to a fourth side of the quartz substrate, which is opposite to the third side and is perpendicular to the Y-axis, and is inclined by the prescribed angle relative to the fourth side;
   a first pair of permanent magnet films that are connected to both ends of the first X-axis GMR element and are longitudinally aligned in parallel with the first side of the quartz substrate;
   a second pair of permanent magnet films that are connected to both ends of the second X-axis GMR element and are longitudinally aligned in parallel with the second side of the quartz substrate;
   a third pair of permanent magnet films that are connected to both ends of the first Y-axis GMR element and are longitudinally aligned in parallel with the third side of the quartz substrate; and
   a fourth pair of permanent magnet films that are connected to both ends of the second Y-axis GMR element and are longitudinally aligned in parallel with the fourth side of the quartz substrate.

2. A magnetic sensor according to claim 1, wherein the prescribed angle is set to 45°.

3. A magnetic sensor according to claim 1, wherein the permanent magnet films are magnetized using at least four permanent magnets, which are arranged in conformity with four corners of the quartz substrate in such a way that adjoining permanent magnets differ from each other in polarity.

4. A magnetic sensor comprising:
   a quartz substrate having a roughly square shape;
   a first X-axis GMR element that is arranged in proximity to and in parallel with a first side of the quartz substrate perpendicular to an X-axis;
   a second X-axis GMR element that is arranged in proximity to and in parallel with a second side of the quartz substrate, which is opposite to the first side and is perpendicular to the X-axis;
   a first Y-axis GMR element that is arranged in proximity to and in parallel with a third side of the quartz substrate perpendicular to a Y-axis;
   a second Y-axis GMR element that is arranged in proximity to and in parallel with a fourth side of the quartz substrate, which is opposite to the third side and is perpendicular to the Y-axis;
   a first pair of permanent magnet films that are connected to both ends of the first X-axis GMR element and are longitudinally aligned in parallel with the first side of the quartz substrate;
   a second pair of permanent magnet films that are connected to both ends of the second X-axis GMR element and are longitudinally aligned in parallel with the second side of the quartz substrate;
   a third pair of permanent magnet films that are connected to both ends of the first Y-axis GMR element and are longitudinally aligned in parallel with the third side of the quartz substrate; and
   a fourth pair of permanent magnet films that are connected to both ends of the second Y-axis GMR element and are longitudinally aligned in parallel with the fourth side of the quartz substrate.

5. A magnetic sensor according to claim 4, wherein the permanent magnet films are magnetized using at least three permanent magnets, which are on a diagonal line and two opposite corners of the quartz substrate in such a way that adjoining permanent magnets differ from each other in polarity.

6. A magnetic sensor according to claim 4, wherein the permanent magnet films are magnetized using at least three permanent magnets of the same polarity, in which one permanent magnet is arranged on a diagonal line of the quartz substrate and the other two permanent magnets are respectively distanced from opposite two corners of the quartz substrate, so that a distance between adjacent permanent magnets is set to be identical to a length of the diagonal line of the quartz substrate.

7. A magnetic sensor comprising:
   a quartz substrate having a roughly square shape;
   an X-axis GMR element that is arranged in proximity to and in parallel with a first side of the quartz substrate perpendicular to an X-axis;
   a Y-axis GMR element that is arranged in proximity to and in parallel with a second side of the quartz substrate perpendicular to a Y-axis;
   a first pair of permanent magnet films that are connected to both ends of the X-axis GMR element and are arranged in parallel with the first side of the quartz substrate; and
   a second pair of permanent magnet films that are connected to both ends of the Y-axis GMR element and are arranged in parallel with the second side of the quartz substrate.

8. A magnetic sensor according to claim 7, wherein the permanent magnet films are magnetized by a magnetic field effected in a direction along a diagonal line of the quartz substrate.

* * * * *

UNITED STATES PATENT AND TRADEMARK OFFICE
CERTIFICATE OF CORRECTION

| | |
|---|---|
| PATENT NO. | : 7,362,548 B2 |
| APPLICATION NO. | : 11/497378 |
| DATED | : April 22, 2008 |
| INVENTOR(S) | : Hideki Sato et al. |

Page 1 of 1

It is certified that error appears in the above-identified patent and that said Letters Patent is hereby corrected as shown below:

Title Page
Related U.S. Application Data should read as follows

(62)  Division of application No. 10/686,261, filed on October 16, 2003, now Pat. No. 7,170,724.

(30)  Foreign Application Priority Data should read as follows

Oct. 18, 2002        (JP)        ………………….. 2002-304392

Mar. 11, 2003        (JP)        ………………….. 2003-065200

Signed and Sealed this

Sixteenth Day of September, 2008

JON W. DUDAS
*Director of the United States Patent and Trademark Office*